(12) United States Patent
Wu et al.

(10) Patent No.: US 9,125,304 B2
(45) Date of Patent: Sep. 1, 2015

(54) CIRCUIT BOARD HAVING VIA AND MANUFACTURING METHOD THEREOF

(71) Applicant: INDUSTRIAL TECHNOLOGY RESEARCH INSTITUTE, Hsinchu (TW)

(72) Inventors: Shih-Hsien Wu, Yangmei (TW); Min-Lin Lee, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/226,526

(22) Filed: Mar. 26, 2014

(65) Prior Publication Data

US 2015/0181693 A1    Jun. 25, 2015

(30) Foreign Application Priority Data

Dec. 20, 2013    (TW) .............................. 102147473 A

(51) Int. Cl.
*H05K 1/11*    (2006.01)
*H05K 3/10*    (2006.01)
(Continued)

(52) U.S. Cl.
CPC .............. *H05K 1/0227* (2013.01); *H05K 1/115* (2013.01); *H05K 3/4685* (2013.01)

(58) Field of Classification Search
CPC ..... H05K 1/112; H05K 3/429; H05K 3/4069; H05K 3/4652; H05K 2201/096
USPC .................. 174/261, 262, 265, 266; 257/774; 438/667; 361/816; 29/831, 846, 852
See application file for complete search history.

(56) References Cited

U.S. PATENT DOCUMENTS

| 5,421,083 A | 6/1995 | Suppelsa et al. |
| 6,388,206 B2 | 5/2002 | Dove et al. |
| 6,717,071 B2 | 4/2004 | Chang et al. |

(Continued)

FOREIGN PATENT DOCUMENTS

| CN | 1953165 A | 4/2007 |
| CN | 100533717 C | 8/2009 |

(Continued)

OTHER PUBLICATIONS

Shaowei Deng et al., Application of transmission line models to backpanel plated through-hole via design, IEEE, 2005, p. 99-102.

(Continued)

*Primary Examiner* — Hoa C Nguyen
(74) *Attorney, Agent, or Firm* — Locke Lord LLP; Tim Tingkang Xia, Esq.

(57) ABSTRACT

The disclosure provides a manufacturing method for a circuit board having a via and including a substrate, a ground conductor, a floated conductor and a signal conductor. The substrate includes a second sheet layer, a second ground layer, a core layer, a first ground layer and a first sheet layer that are stacked in sequence from bottom to top. The ground conductor penetrates through the core layer and is electrically coupled to the first ground layer and the second ground layer. The floated conductor penetrates through the core layer and is electrically insulated from the first ground layer, the second ground layer and the ground conductor. The signal conductor penetrates through the substrate, being located between the ground conductor and the floated conductor, and insulated from the first ground layer, the second ground layer, the ground conductor and the floated conductor.

19 Claims, 25 Drawing Sheets

(51) Int. Cl.
*H05K 1/02* (2006.01)
*H05K 3/46* (2006.01)

(56) References Cited

U.S. PATENT DOCUMENTS

| | | |
|---|---|---|
| 6,787,710 B2 | 9/2004 | Uematsu et al. |
| 7,360,308 B2 | 4/2008 | Oggioni et al. |
| 7,372,143 B2 | 5/2008 | Nakamura et al. |
| 7,394,027 B2 | 7/2008 | Kaluzni et al. |
| 7,404,250 B2 | 7/2008 | Cheng et al. |
| 7,409,668 B2 | 8/2008 | Lin et al. |
| 7,508,079 B2 * | 3/2009 | Higashi .............. 257/774 |
| 7,561,410 B1 | 7/2009 | Lee et al. |
| 7,589,390 B2 | 9/2009 | Yao |
| 7,602,059 B2 | 10/2009 | Nobutaka et al. |
| 7,808,072 B2 | 10/2010 | Choi et al. |
| 8,058,956 B2 | 11/2011 | Jow et al. |
| 8,227,889 B2 | 7/2012 | Kuo |
| 8,304,666 B2 | 11/2012 | Ko et al. |
| 8,541,884 B2 | 9/2013 | Conn et al. |
| 2002/0080556 A1 * | 6/2002 | Japp et al. ............ 361/306.3 |
| 2005/0146390 A1 | 7/2005 | Baek |
| 2005/0178585 A1 * | 8/2005 | Kim et al. ............ 174/262 |
| 2005/0247482 A1 * | 11/2005 | Nakamura ............ 174/262 |
| 2006/0200977 A1 * | 9/2006 | Lauffer et al. ............ 29/830 |
| 2006/0258187 A1 | 11/2006 | Behziz |
| 2007/0089292 A1 | 4/2007 | Tourne et al. |
| 2007/0124930 A1 | 6/2007 | Cheng et al. |
| 2009/0159322 A1 * | 6/2009 | Wu et al. ............ 174/260 |
| 2010/0163296 A1 | 7/2010 | Ko et al. |
| 2011/0005814 A1 | 1/2011 | Liu et al. |
| 2011/0095851 A1 | 4/2011 | Wyland |
| 2011/0203842 A1 | 8/2011 | Russell |
| 2012/0112868 A1 | 5/2012 | Wu et al. |
| 2012/0187550 A1 | 7/2012 | Wu |
| 2012/0250281 A1 * | 10/2012 | Kawai et al. ............ 361/774 |
| 2014/0145883 A1 * | 5/2014 | Baks et al. ............ 343/700 MS |

FOREIGN PATENT DOCUMENTS

| | | |
|---|---|---|
| CN | 101945537 A | 1/2011 |
| TW | I242783 B | 11/2005 |
| TW | 200718305 | 5/2007 |
| TW | I323625 B | 4/2010 |
| TW | 201112892 A | 4/2011 |
| TW | I396480 B | 5/2013 |

OTHER PUBLICATIONS

Jun So Pak et al., Coupling of through-hole signal via to power/ground resonance and excitation of edge radiation in multi-layer PCB, IEEE, 2003, p. 231-235.

Shaowei Deng et al., Effects of open stubs associated with plated through-hole vias in backpanel designs, IEEE.

Yoshiyuki Takasu et al., Simulated high-frequency characteristics of coaxial via connection structures in printed circuit boards using three-dimensional electromagnetic field analysis. Japan.

Wu, Zhaohua, Study on signal transmission performance of microwave multi-chip modules interconnect via hole structure, International Conference on Electronic Packaging Technology & High Density Packaging, IEEE, 2012, p. 1352-1356.

\* cited by examiner

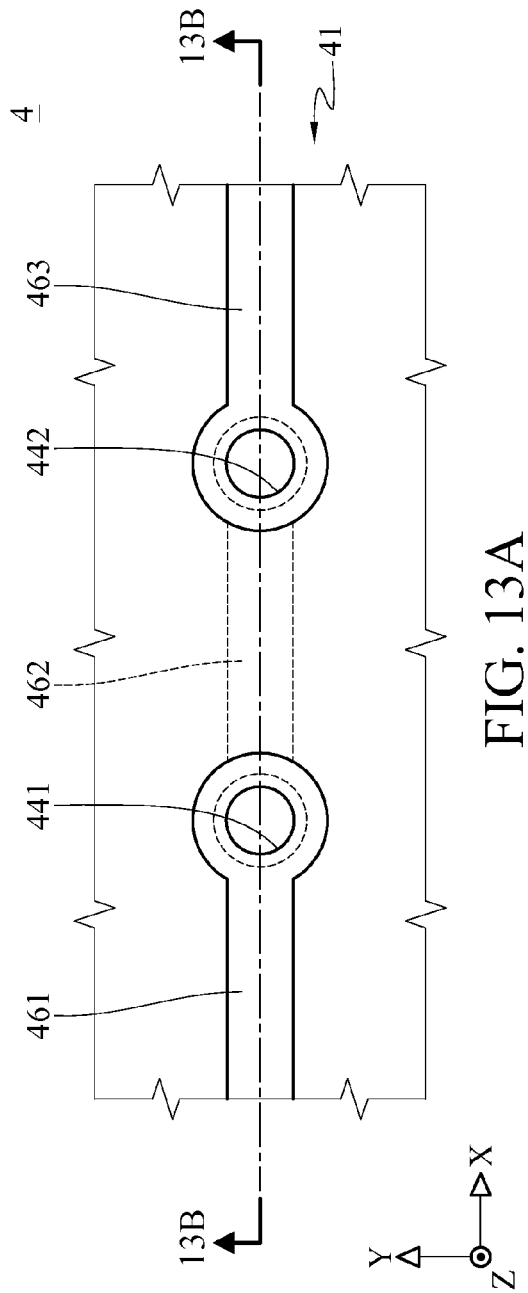
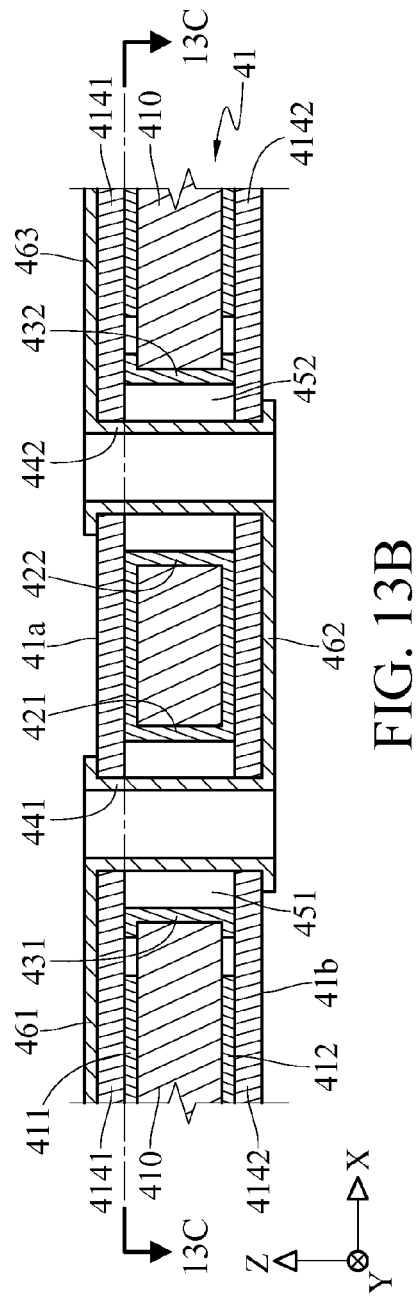
FIG. 13A
FIG. 13B

CIRCUIT BOARD HAVING VIA AND MANUFACTURING METHOD THEREOF

CROSS-REFERENCE TO RELATED APPLICATIONS

This non-provisional application claims priority under 35 U.S.C. §119(a) on Patent Application No(s). 102147473 filed in Taiwan, R.O.C. on Dec. 20, 2013, the entire contents of which are hereby incorporated by reference.

TECHNICAL FIELD

The disclosure relates to a circuit board having a via and manufacturing method thereof.

BACKGROUND

In the design of circuitry, a signal is usually transmitted from one circuit layer to another through a via which is electrically coupled to the two circuit layers. The conventional coaxial via comprises a signal conductor, a dielectric member surrounding the periphery of the signal conductor, and a circular ground conductor surrounding the periphery of the dielectric member.

However, the space of layout of circuitry is limited on a substrate, so the dimension of the coaxial via is relatively smaller, and therefore the impedance of the signal conductor of the coaxial via is smaller than the impedance of a transmission wire (The impedance of a general transmission wire is 50 ohms). The different impedance between the transmission wire and the signal conductor of the coaxial via causes the reflection effect of signal transmission when signal is transmitted between the circuit layer and the signal conductor of the coaxial hole, especially when the signal transmits at high speed, the signal distortion occurs seriously. Therefore, it is important to reduce the reflection effect of the signal transmission in order to enhance the quality of the signal transmission.

SUMMARY

A circuit board having a via comprises a substrate, a ground conductor, a floated conductor and a signal conductor. The substrate comprises a first sheet layer, a first ground layer, a core layer, a second ground layer and a second sheet layer. The second sheet layer, the second ground layer, the core layer, the first ground layer and the first sheet layer are stacked in sequence. The ground conductor penetrates through the core layer and is electrically coupled to the first ground layer and the second ground layer. The floated conductor penetrates through the core layer and is electrically insulated from the first ground layer, the second ground layer and the ground conductor. The signal conductor penetrates through the substrate, being located between the ground conductor and the floated conductor, and being insulated from the first ground layer, the second ground layer, the ground conductor and the floated conductor.

A manufacturing method, for a circuit board having a via, comprises the following steps. A first ground layer and a second ground layer are formed on two opposite sides of a core layer, respectively. A connecting hole is formed and penetrates through the core layer, the first ground layer and the second ground layer. A conductive film is formed on an inner wall of the connecting hole, and the conductive film is electrically coupled to the first ground layer and the second ground layer. A first separation groove and a second separation groove opposite to each other are formed by removing a portion of the first ground layer and a portion of the second ground layer, and the first separation groove and the second separation groove both are located at a portion of the periphery of the connecting hole. A plurality of separation holes is formed at the periphery of the connecting hole, the plurality of separation holes are formed within the first ground layer, the core layer, the second ground layer and the conductive film. The locations of the plurality of separation holes are partially overlapped with the first separation groove, the second separation groove and the connecting hole. The conductive film is divided into a ground conductor and a floated conductor by the separation holes, the first separation groove and the second separation groove. The ground conductor is electrically coupled to the first ground layer and the second ground layer, and the floated conductor is electrically insulated from the first ground layer, the second ground layer and the ground conductor. A signal conductor is formed inside the connecting hole, and the signal conductor is electrically insulated from the first ground layer, the second ground layer, the ground conductor and the floated conductor.

A manufacturing method, for a circuit board having a via, comprises the following steps. A first ground layer and a second ground layer are formed on two opposite surfaces of a core layer. A connecting hole is formed and penetrates through the core layer, the first ground layer and the second ground layer. A conductive film is formed on an inner wall of the connecting hole, and the conductive film is electrically coupled to the first ground layer and the second ground layer. A first separation groove and a second separation groove opposite to each other are formed by removing a portion of the first ground layer and a portion of the second ground layer. The first separation groove and the second separation groove are both located at a portion of the periphery of the connecting hole. The connecting hole is filled with a first dielectric member. A first sheet layer is formed on a surface formed by the first ground layer and the first dielectric member together. A second sheet layer is formed on another surface formed by the second ground layer and the first dielectric member together. A through hole is formed within the first sheet layer, the first ground layer, the core layer, the second ground layer, the first dielectric member and the second sheet layer. An inner wall of the through hole is separated from the conductive film. A signal conductor is formed on an inner wall of the through hole, and the signal conductor is electrically insulated with the first ground layer, the second ground layer and the conductive film. A plurality of separation holes is formed in the periphery of the connecting hole, and inner walls of the plurality of separation holes and the signal conductor are separated by an interval. Each of the plurality of separation holes penetrates through the first sheet layer, the first ground layer, the core layer, the second ground layer, the conductive film, the first dielectric member and the second sheet layer. The locations of the plurality of separation holes are partially overlapped with the first separation groove, the second separation groove and the connecting hole, and the conductive film is divided into a ground conductor and a floated conductor by the plurality of separation holes, the first separation groove and the second separation groove. The ground conductor is electrically coupled to the first ground layer and the second ground layer, and the floated conductor is electrically insulated from the signal conductor, the first ground layer, the second ground layer and the ground conductor.

BRIEF DESCRIPTION OF THE DRAWINGS

The present disclosure will become more fully understood from the detailed description given hereinbelow, along with the accompanying drawings which are for illustration only, thus are not limitative of the present disclosure, and wherein:

FIGS. 2A to 9A are top views of steps for manufacturing the circuit board having the via in FIGS. 1A, 1B, 1C, 1D and 1E;

FIGS. 2B to 9B are side views of steps for manufacturing the circuit board having the via in FIGS. 1A, 1B, 1C, 1D and 1E;

FIG. 13A is a top view of a circuit board having a via according to another embodiment of the disclosure;

FIG. 13B is a front cross-sectional view of the circuit board having the via along a line 13B-13B in FIG. 13A;

FIGS. 15A to 19A are top views of steps for manufacturing the circuit board having the via in FIGS. 14A, 14B, 14C, 14D and 14E;

FIGS. 15B to 19B are front views of steps for manufacturing the circuit board having the via in FIGS. 14A, 14B, 14C, 14D and 14E; and FIGS. 15C to 19C are side views of steps for manufacturing the circuit board having the via in FIGS. 14A, 14B, 14C, 14D and 14E.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

Figure 1A:
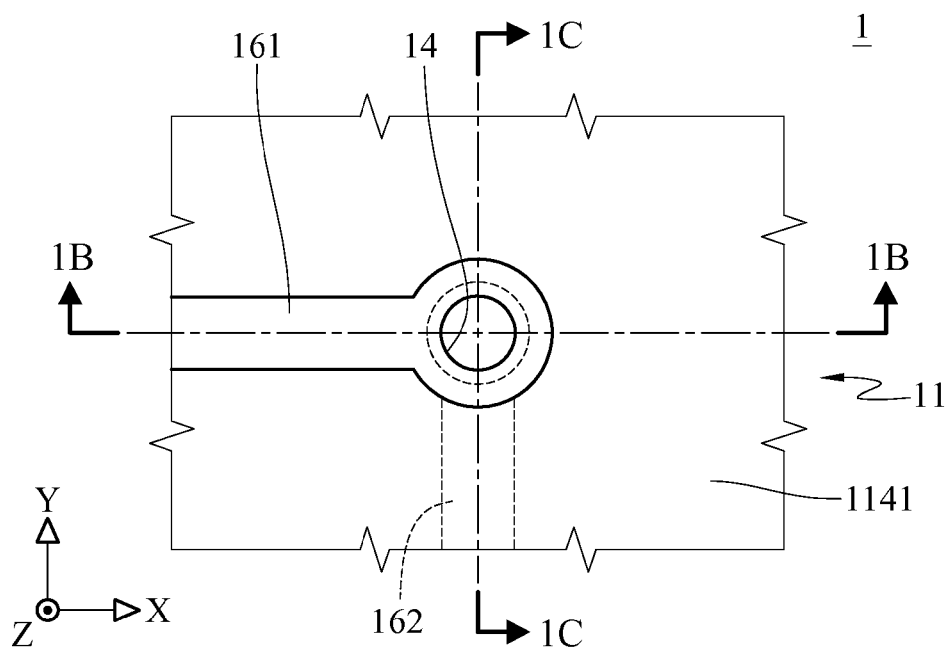
FIG. 1A is a top view of a circuit board having a via according to an embodiment of the disclosure.
Figure 1B:
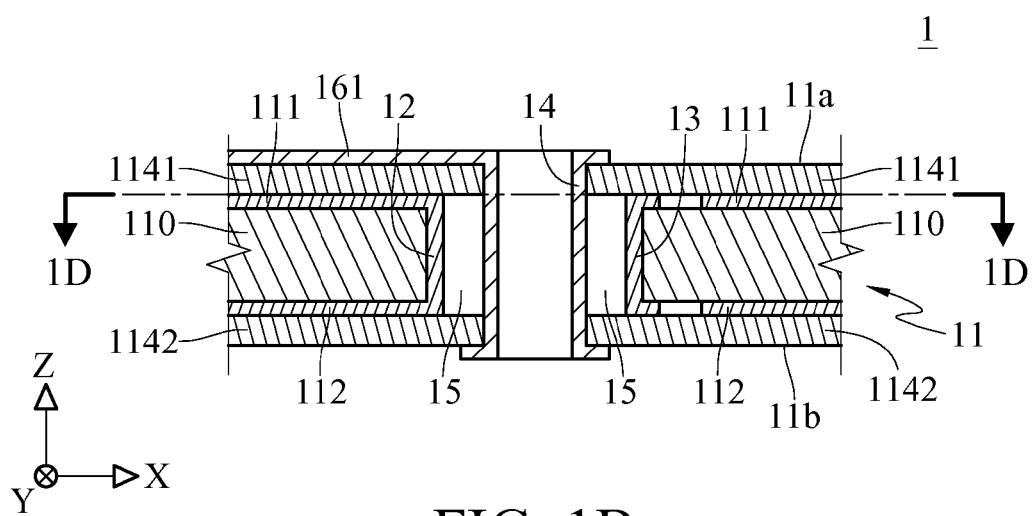
FIG. 1B is a front cross-sectional view of the circuit board having the via along a line 1B-1B in FIG. 1A.
Figure 1C:
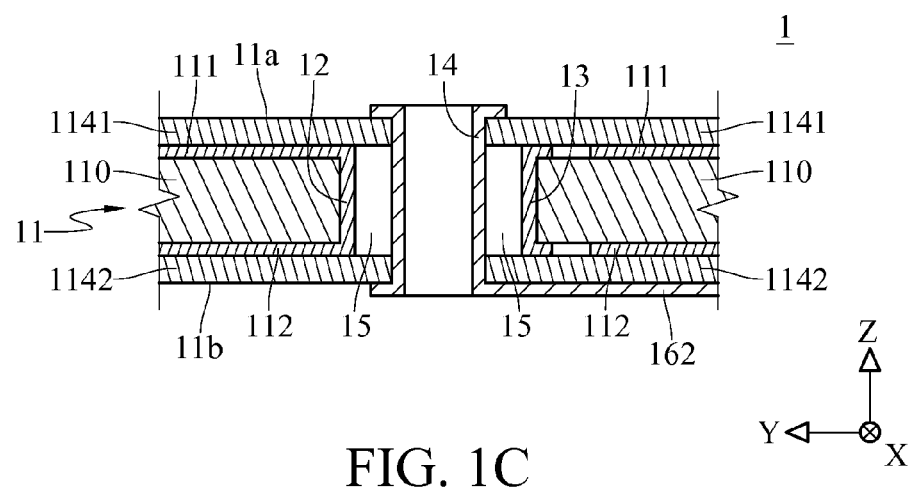
FIG. 1C is a front cross-sectional view of the circuit board having the via along a line 1C-1C in FIG. 1A.
Figure 1D:
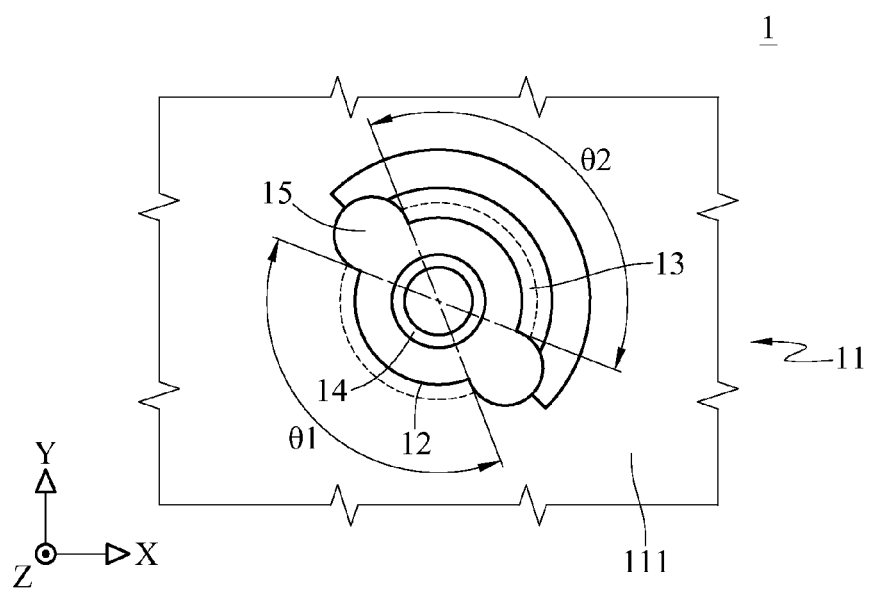
FIG. 1D is a front cross-sectional view of the circuit board having the via along a line 1D-1D in FIG. 1B.
Figure 1E:
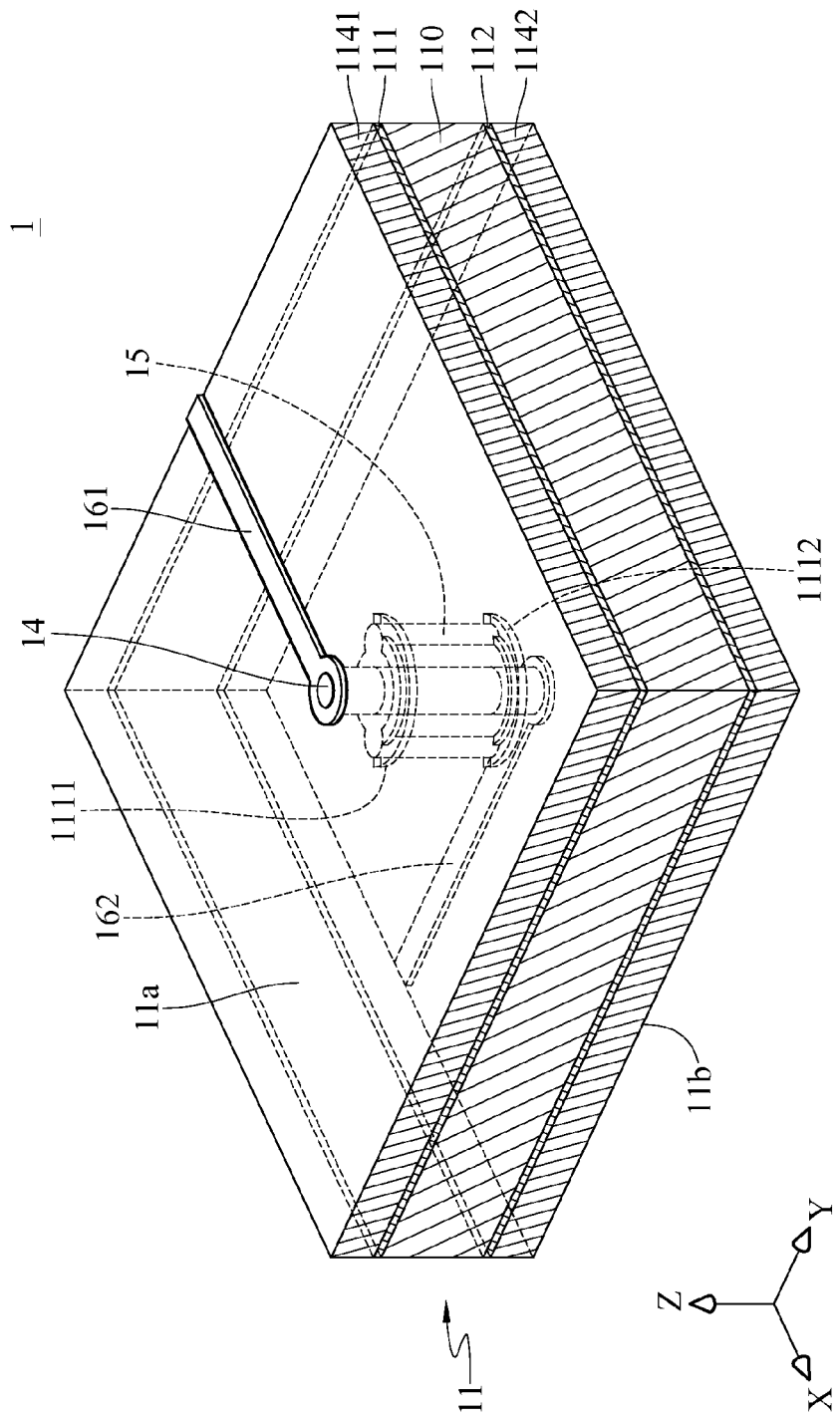
FIG. 1E is a schematic perspective view of the circuit board having the via in FIG. 1A.

Please refer to FIGS. 1A, 1B, 1C, 1D and 1E, FIG. 1A is a top view of a circuit board having a via according to an embodiment of the disclosure, FIG. 1B is a front cross-sectional view of the circuit board having the via along a line 1B-1B in FIG. 1A, FIG. 1C is a front cross-sectional view of the circuit board having the via along a line 1C-1C in FIG. 1A, FIG. 1D is a front cross-sectional view of the circuit board having the via along a line 1D-1D in FIG. 1B, and FIG. 1E is a schematic perspective view of the circuit board having the via in FIG. 1A. In this embodiment, a circuit board having a via 1 comprises a substrate 11, a ground conductor 12, a floated conductor 13, a signal conductor 14, at least one dielectric member 15, a first conductive wire 161 and a second conductive wire 162.

The substrate 11 comprises a first sheet layer 1141, a first ground layer 111, a core layer 110, a second ground layer 112 and a second sheet layer 1142. The second sheet layer 1142, the second ground layer 112, the core layer 110, the first ground layer 111 and the first sheet layer 1141 that are stacked in sequence from bottom to top. The first sheet layer 1141 has a first surface 11a facing oppositely away from the first ground layer 111. The second sheet layer 1142 has a second surface 11b facing oppositely away from the second ground layer 112.

The ground conductor 12 penetrates through the core layer 110 and is electrically coupled to the first ground layer 111 and the second ground layer 112.

The floated conductor 13 penetrates through the core layer 110 and is electrically insulated from the first ground layer 111, the second ground layer 112 and the ground conductor 12. The distance between the floated conductor 13 and the signal conductor 14 is substantially equal to the distance between the ground conductor 12 and the signal conductor 14. The range of angle θ2 of the floated conductor 13 surrounding the signal conductor 14 is substantially equal to the range of angle θ1 of the ground conductor 12 surrounding the signal conductor 14. Actually, the range of angle θ2 of the floated conductor 13 surrounding the signal conductor 14 may not be exactly equal to the range of angle θ1 of the ground conductor 12 surrounding the signal conductor 14 due to the error or deviation during manufacturing. Therefore, in this disclosure, the range of angle θ2 of the floated conductor 13 surrounding the signal conductor 14 is substantially equal to the range of angle θ1 of the ground conductor 12 surrounding the signal conductor 14.

The signal conductor 14 penetrates through the first sheet layer 1141, the first ground layer 111, the core layer 110, the second ground layer 112 and the second sheet layer 1142 of the substrate 11, and the signal conductor 14 is located between the ground conductor 12 and the floated conductor 13. The signal conductor 14 is electrically insulated from the first ground layer 111, the second ground layer 112, the ground conductor 12 and the floated conductor 13. In this disclosure, "being penetrating through" means that the signal conductor 14 passes through the first sheet layer 1141 and the second sheet layer 1142, and is in contact with the first sheet layer 1141 and the second sheet layer 1142. Alternatively, the signal conductor 14 may pass through the first ground layer 111, the core layer 110 and the second ground layer 112 without being in contact with or coupled with the first ground layer 111, the core layer 110 and the second ground layer 112.

The dielectric member 15 is located between the signal conductor 14 and the ground conductor 12, between the signal conductor 14 and floated conductor 13, as well as between the ground conductor 12 and the floated conductor 13.

The first conductive wire 161 is mounted on the first surface 11a of the first sheet layer 1141 and electrically coupled to the signal conductor 14. The second conductive wire 162 is mounted on the second surface 11b of the second sheet layer 1142 and electrically to the signal conductor 14. The floated conductor 13 is located at one side of the periphery of the signal conductor 14 facing oppositely away from the first conductive wire 161 and the second conductive wire 162. In other words, the floated conductor 13 is not overlapped with the first conductive wire 161 and the second conductive wire 162. The ground conductor 12 is located between the first conductive wire 161 and the second conductive wire 162. For example, take the center of the signal conductor 14 as the center of the coordinate, the first conductive wire 161 is located at the negative-X-axis direction of the signal conductor 14, and the second conductive wire 162 is located at the negative-y-axis direction of the signal conductor 14. The ground conductor 12 is located at the second, third and fourth quadrant of the signal conductor 14 and covers the negative x axis and the negative y axis. The floated conductor 13 is located at the fourth, first and second quadrant of the signal conductor 14 and away from the negative x axis and the negative y axis.

Please refer to FIGS. 2A to 9A and 2B to 9B, FIGS. 2A to 9A are top views of steps for manufacturing the circuit board having the via in FIGS. 1A, 1B, 1C, 1D and 1E, and FIGS. 2B to 9B are side views of steps for manufacturing the circuit board having the via in FIGS. 1A, 1B, 1C, 1D and 1E. The following describes the manufacturing method of the circuit board having the via.

Figure 2A:
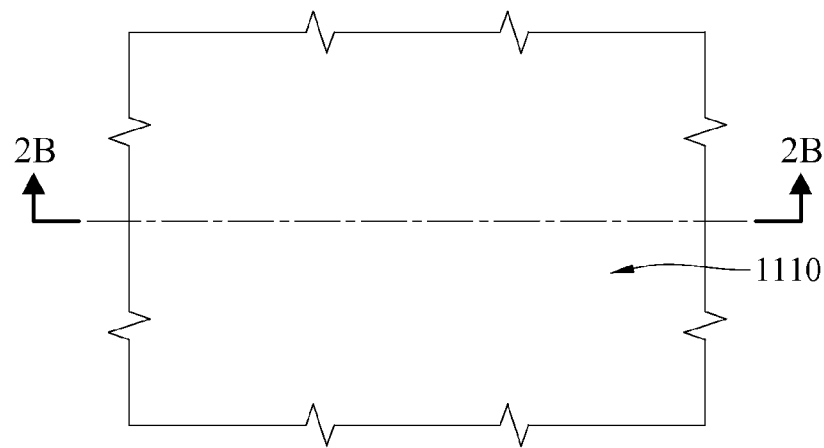
Figure 2B:
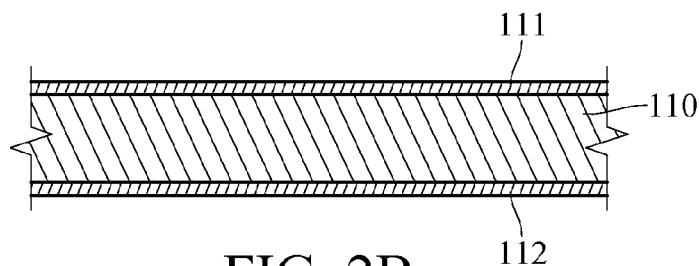

As shown in FIGS. 2A and 2B, a first ground layer 111 and a second ground layer 112 are formed on two opposite surface of a core layer 110, respectively.

Figure 3A:
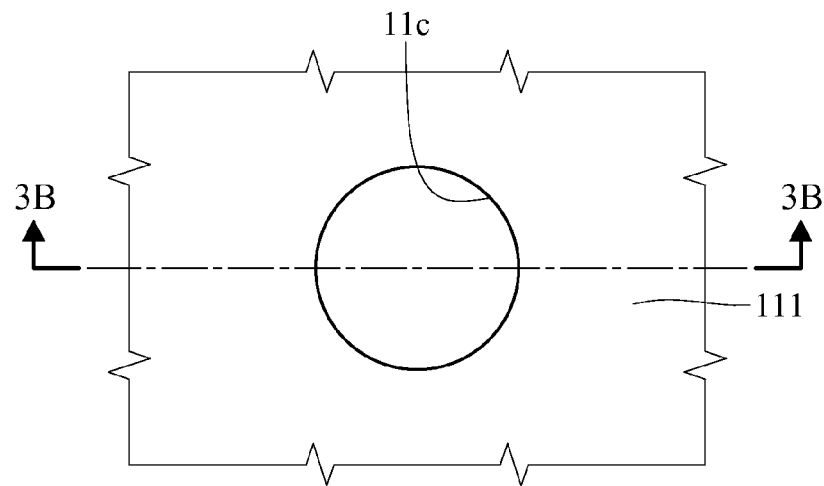
Figure 3B:
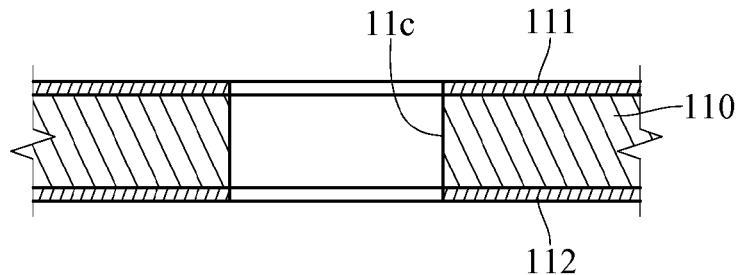

As shown in FIGS. 3A and 3B, a connecting hole 11c is formed and penetrates through the first ground layer 111, the core layer 110 and the second ground layer 112.

Figure 4A:
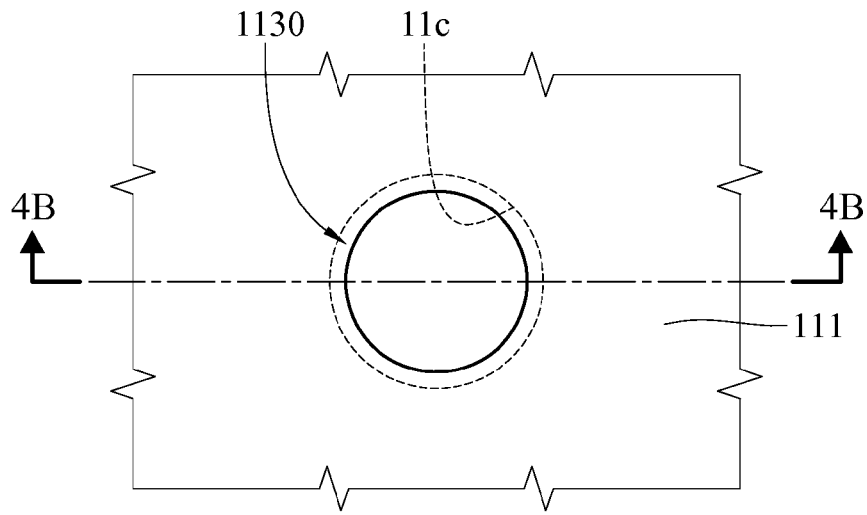
Figure 4B:
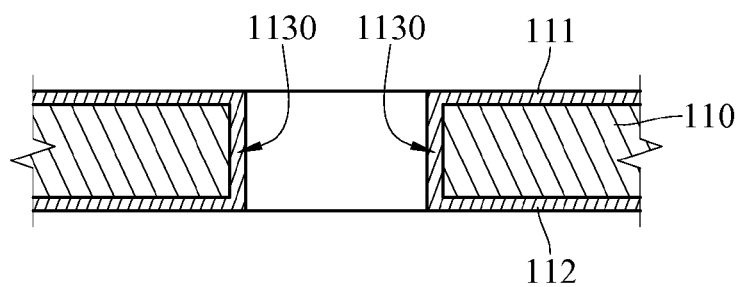

As shown in FIGS. 4A and 4B, a conductive film 1130 is formed on an inner wall of the connecting hole 11c. The conductive film 1130 is electrically coupled to the first ground layer 111 and the second ground layer 112.

Figure 5A:
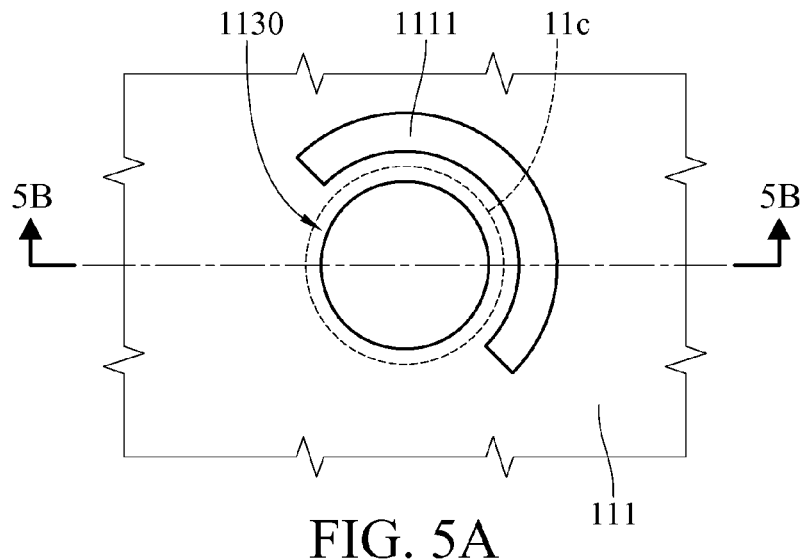
Figure 5B:
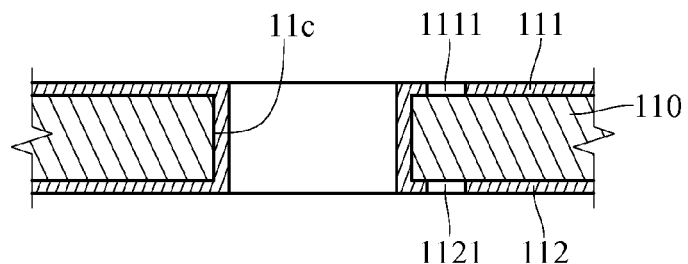

As shown in FIGS. 5A and 5B, a portion of the first ground layer 111 and a portion of the second ground layer 112 are removed to form a first separation groove 1111 and a second separation groove 1121, respectively. The first separation groove 1111 and the second separation groove 1121 are located at a portion of the periphery of the connecting hole 11c, respectively.

Figure 6A:
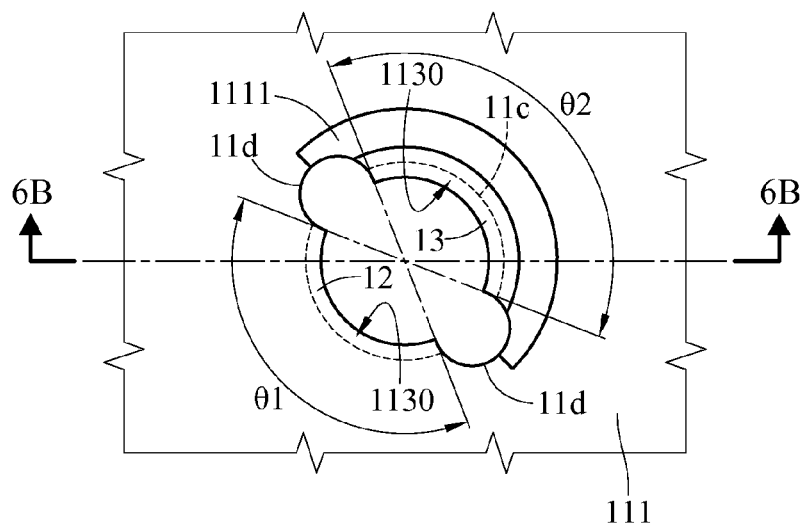
Figure 6B:
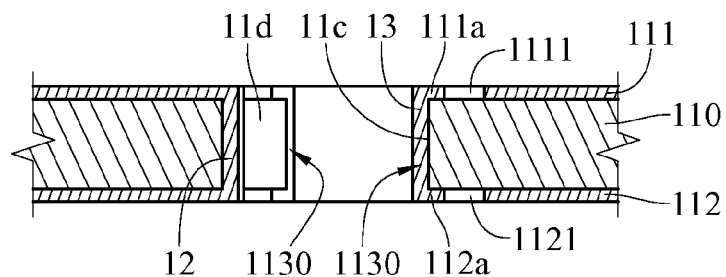

As shown in FIGS. 6A and 6B, two separation holes 11d are formed at the periphery of the connecting hole 11c. One of the separation holes 11d coupled to one end of the first separation groove 1111 and one end of the second separation groove 1121, and the other separation holes 11d is coupled to the other end of the first separation groove 1111 and the other end of the second separation groove 1121. The separation holes 11d are formed within the first ground layer 111, the core layer 110, the second ground layer 112 and the conductive film 1130. The locations of the two separation holes 11d are partially overlapped with the first separation groove 1111, the second separation groove 1121 and the connecting hole 11c. The conductive film 1130 is divided into a ground conductor 12 and a floated conductor 13 by the two separation holes 11d, the first separation groove 1111 and the second separation groove 1121. The ground conductor 12 is electrically coupled to the first ground layer 111 and the second ground layer 112. The floated conductor 13 is electrically insulated from the first ground layer 111, the second ground layer 112 and the ground conductor 12. Although the floated conductor 13 includes a small portion of the first ground layer 111a located between the periphery of the connecting hole 11c and the first separation groove 1111 and includes a small portion of the second ground layer 112a located between the periphery of the connecting hole 11c and the second separation groove 1121, "the electrical insulation of the floated conductor 13" in this disclosure means that the floated conductor 13 is electrically insulated from a major portion of the first ground layer 111 and a major portion of the second ground layer 112. Moreover, the range of angle θ2 of the floated conductor 13 and the range of angle θ1 of the ground conductor 12 may be adjusted by manufacturers according to the sizes and locations of the patterns of the first separation groove 1111 and the second separation groove 1121. In this embodiment, the range of angle θ2 of the floated conductor 13 is substantially equal to the range of angle θ1 of the ground conductor 12.

As shown in FIGS. 6A, 6B, 7A and 7B, the connecting hole 11c and the separation holes 11d are filled with the dielectric member 15 such that the floated conductor 13 is electrically insulated from the ground conductor 12, the first ground layer 111 and the second ground layer 112. Furthermore, the first separation groove 1111 and the second separation groove 1121 may be filled with the dielectric member 15.

Figure 7A:
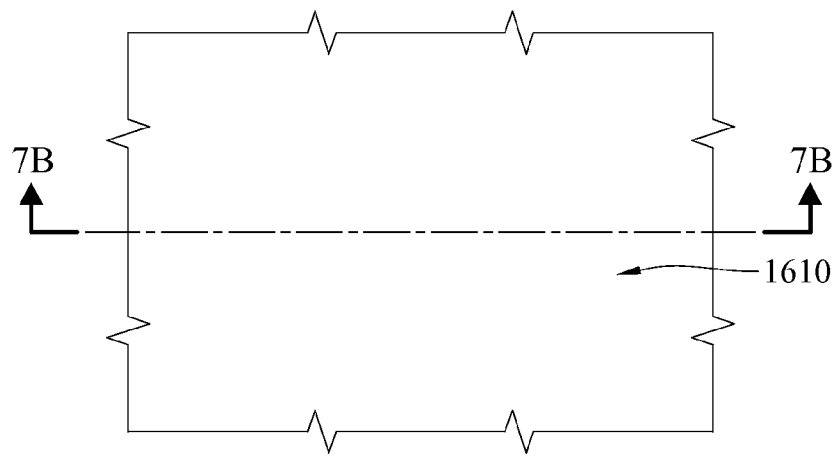
Figure 7B:
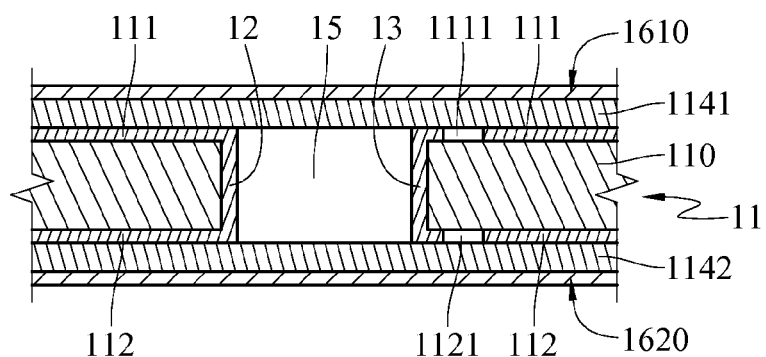

As shown in FIGS. 7A and 7B, a first sheet layer 1141 is formed on a surface formed by the first ground layer 111, the ground conductor 12, the floated conductor 13 and the dielectric member 15 together. A second sheet layer 1142 is formed on a surface formed by the second ground layer 112, the ground conductor 12, the floated conductor 13 and the dielectric member 15 together. Since the first separation groove 1111 and the second separation groove 1121 are filled with the dielectric member 15, it prevents air from entering the first separation groove 1111 and the second separation groove 1121. Therefore, the circuit board having the via 1 may not be cracked because of the expansion of air between the first sheet layer 1141, the core layer 110 and the second sheet layer 1142. However, the disclosure is not limited to that the first separation groove 1111 and the second separation groove 1121 are filled with the dielectric member 15. In other embodiments, the first separation groove 1111 and the second separation groove 1121 may not be filled with the dielectric member 15, but the material of the first sheet layer 1141 is filled in the first separation groove 1111 and the material of the second sheet layer 1142 is filled in the second separation groove 1121 when the first sheet layer 1141 and the second sheet layer 1142 are formed and laminated. Moreover, since the first separation groove 1111 and the second separation groove 1121 are filled with the first sheet layer 1141 and the second sheet layer 1142, respectively, it may prevent air from entering the first separation groove 1111 and the second separation groove 1121. Therefore, the circuit board having the via 1 may not be cracked because of the expansion of air between the first sheet layer 1141, the core layer 110 and the second sheet layer 1142.

After finishing the above-mentioned manufacturing steps shown in FIGS. 2A to 7A and FIGS. 2B to 7B, the ground conductor 12 in the substrate 11 may be electrically coupled to the first ground layer 111 and the second ground layer 112, and the floated conductor 13 in the substrate 11 is electrically insulated from the ground conductor 12, the first ground layer 111 and the second ground layer 112. Afterwards, a first conductive wire layer 1610 is mounted on the first sheet layer 1141, and the second conductive wire layer 1620 is mounted on the second sheet layer 1142.

Figure 8A:
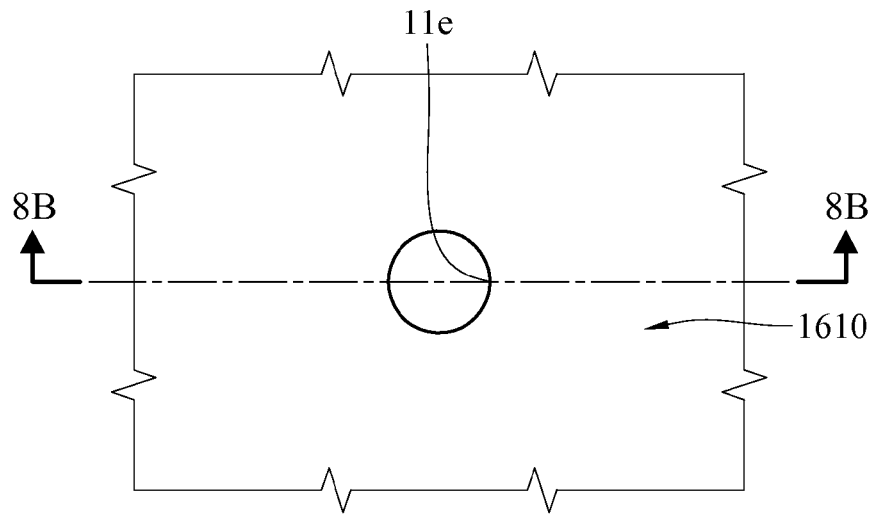
Figure 8B:
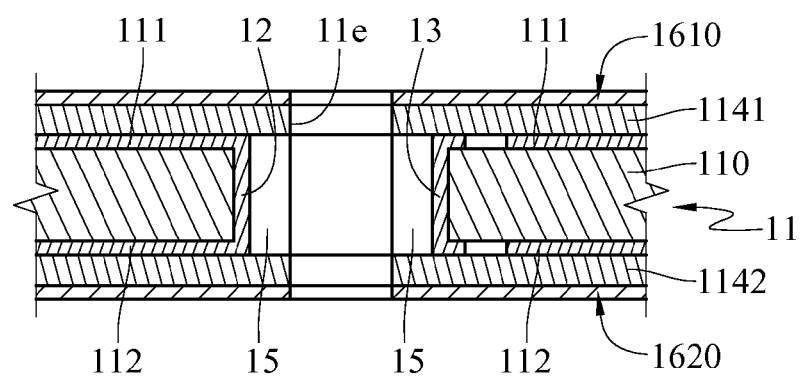

As shown in FIGS. 8A and 8B, a through hole 11e is formed within the first sheet layer 1141, the first ground layer 111, the core layer 110, the second ground layer 112 and the second sheet layer 1142 of the substrate 11, the dielectric member 15, the first conductive wire layer 1610 and the second conductive wire layer 1620. The inner wall of the through hole 11e is separated from the first ground layer 111 and the second ground layer 112. The through hole 11e is located between the ground conductor 12 and the floated conductor 13, and the inner wall of the through hole 11e is separated from the ground conductor 12 and the floated conductor 13. In this disclosure, the forming of the through hole 11e may be in contact with the first sheet layer 1141, the second sheet layer 1142, the dielectric member 15, the first conductive wire layer 1610 and the second conductive wire layer 1620. Alternatively, the through hole 11e may be formed within the first ground layer 111, the core layer 110 and the second ground layer 112 without being in direct contact with the first ground layer 111, the core layer 110 and the second ground layer 112. In this embodiment, the distance between the inner wall of the through hole 11e and the floated conductor 13 is substantially equal to the distance between the inner wall of the through hole 11e and the ground conductor 12.

Figure 9A:
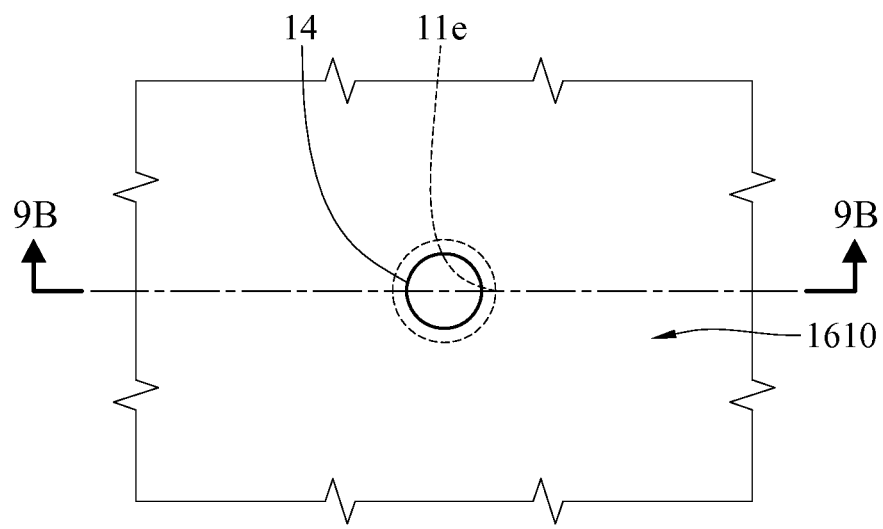
Figure 9B:
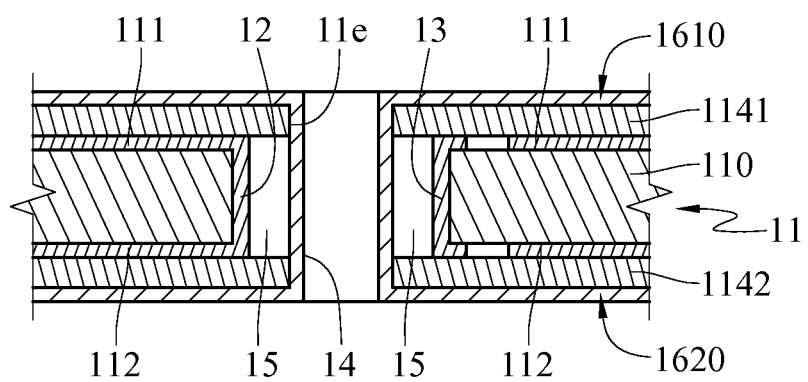

As shown in FIGS. 9A and 9B, a signal conductor 14 is formed on the inner wall of the through hole 11e. The first conductive wire layer 1610 and the second conductive wire layer 1620 are electrically coupled to the signal conductor 14. The shape of the signal conductor 14 is hollow tubular shape. In other embodiments, the signal conductor 14 is a solid tube. When the signal conductor 14 is hollow tube, the signal conductor 14 may be filled with a filling material. Then, referring to FIGS. 1A, 1B, 1C, 1D and 1E together, the first conductive wire layer 1610 is capable of being patterned to form a first conductive wire 161 electrically coupled to the signal conductor 14, and the second conductive wire layer 1620 is capable of being patterned to form a second conductive wire 162 electrically coupled to the signal conductor 14. The floated conductor 13 is located at a side of the periphery of the signal conductor 14 facing oppositely away from the first conductive wire 161 and the second conductive wire 162. The ground conductor 12 is located between the first conductive wire 161 and the second conductive wire 162. Furthermore, since the distance between the inner wall of the through hole 11e and the floated conductor 13 is substantially equal to the distance between the inner wall of the through hole 11e and the ground conductor 12, the distance between the signal conductor 14 and the floated conductor 13 is substantially equal to the distance between the signal conductor 14 and the ground conductor 12.

Figure 10:
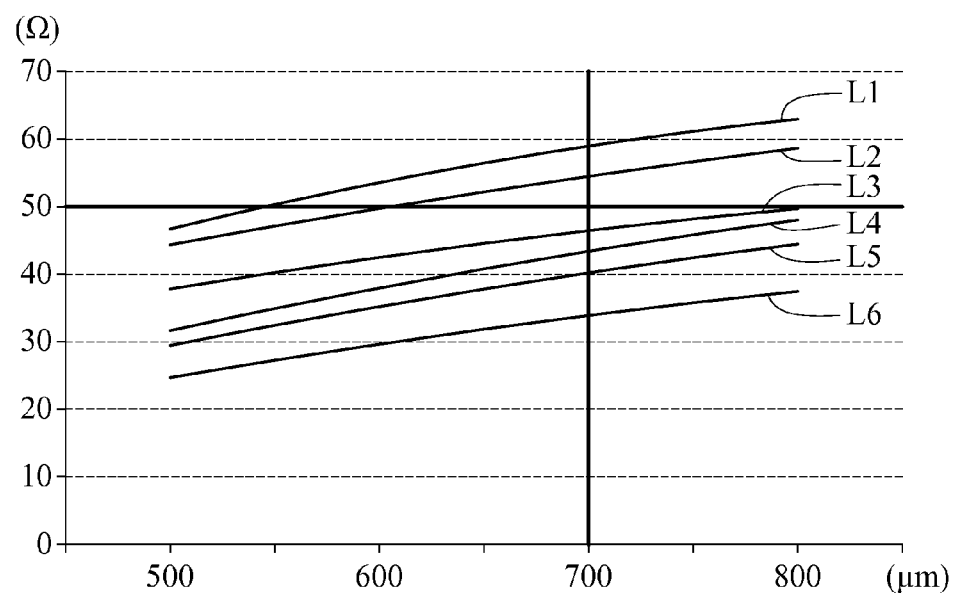
FIG. 10 is a graph of comparison with the impedance of a signal conductor of the circuit board having the via according to an embodiment of the disclosure and that of a signal conductor of a conventional coaxial transmission via.

Please refer to FIG. 10, which is a graph of comparison with the impedance of a signal conductor of the circuit board having the via according to an embodiment of the disclosure and that of a signal conductor of a conventional coaxial transmission via. In FIG. 10, lines L1, L2 and L3 represent the relationships between the impedances of the signal conductor 14 of the semi coaxial transmission via of the circuit board having the via 1 and the inner diameters of the ground conductor 12 and the floated conductor 13 when the dielectric constants of the dielectric member 15 are 4.9, 3.5 and 3.0.

Lines L4, L5 and L6 represent the relationships between the impedances of the signal conductor of the semi coaxial transmission via and the inner diameters of the ground conductor 12 when the dielectric constants of the dielectric member are 4.9, 3.5 and 3.0. The unit of the inner diameter is micrometer (μm), and the unit of the impedances is ohm. The outer diameter of the signal conductor 14 is 200 μm. The conventional coaxial transmission via only comprises a signal conductor 14, a dielectric member 15 surrounding the signal conductor 14 and a ground conductor 12 fully surrounding the dielectric member 15. As shown in FIG. 10, the greater the dielectric constant of the dielectric member 15 is, the bigger the inner diameters of the ground conductor 12 and the floated conductor 13 and the impedance of the signal conductor 14 of the circuit board having the via 1 are. Comparing with the conventional coaxial transmission via, even the dielectric constant of the dielectric member 15 and the inner diameters of the ground conductor 12 and the floated conductor 13 are the same, the impedance of the path of signal transmission of the via is greater than that of the signal conductor of the conventional coaxial transmission via. Thus, even when the circuit board having the via 1 is in a limited space, the impedance of the path of signal transmission of the via may match those of the first conductive wire 161 and the second conductive wire 162, thereby applicable to high-speed transmission. In this disclosure, the path of signal transmission of the via means a combination of the ground conductor 12, the signal conductor 14 and the dielectric member 15 through which the current transmits.

Figure 11A:
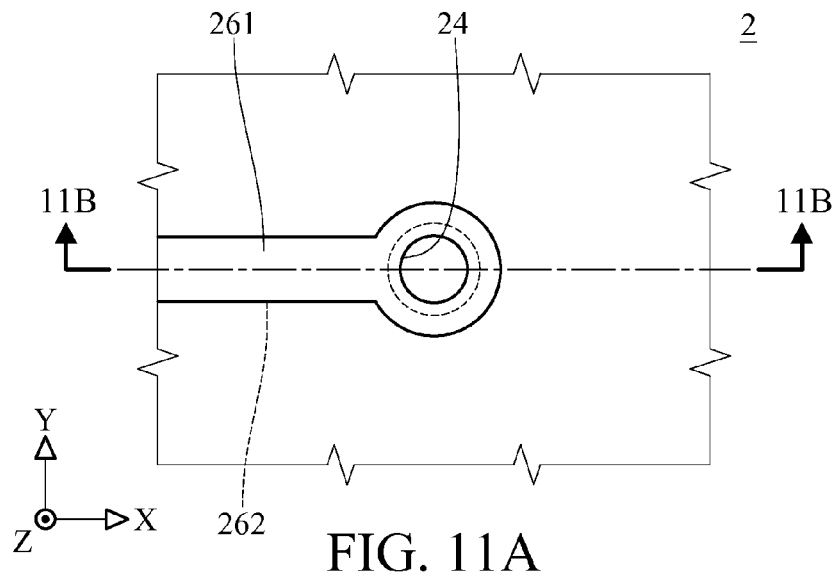
FIG. 11A is a top view of a circuit board having a via according to another embodiment of the disclosure.
Figure 11B:
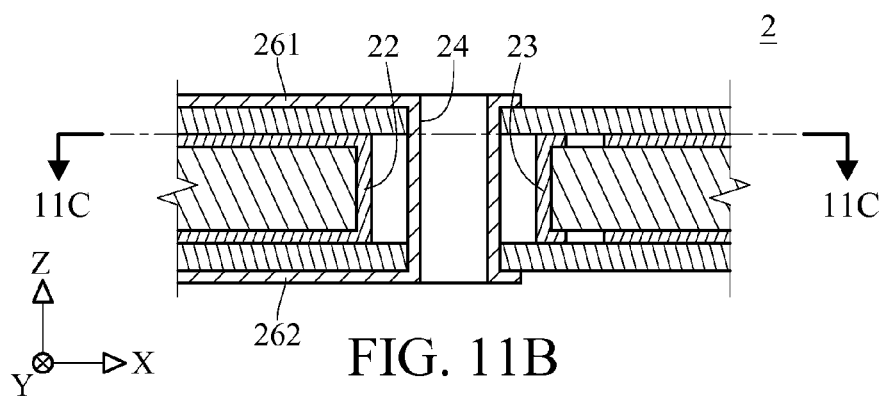
FIG. 11B is a front cross-sectional view of the circuit board having the via along a line 11B-11B in FIG. 11A.
Figure 11C:
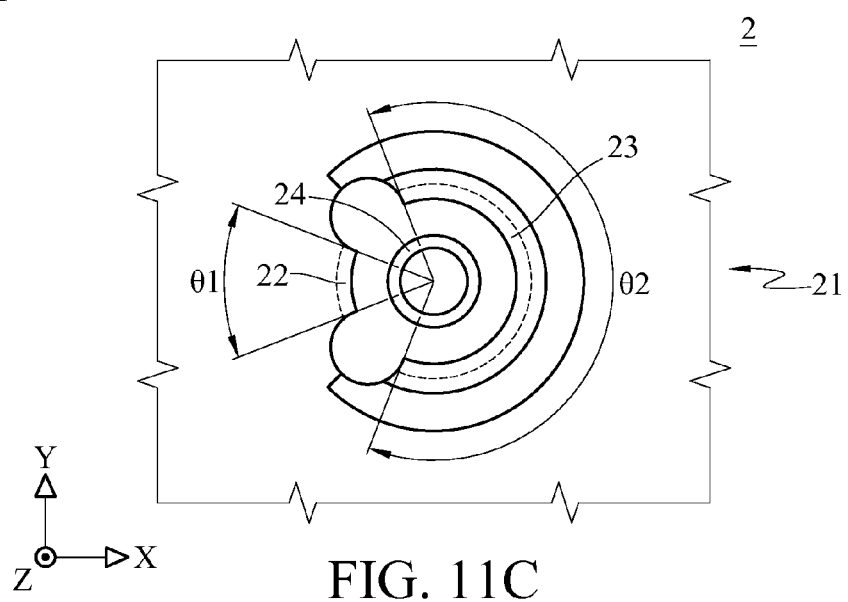
FIG. 11C is a top cross-sectional view of the circuit board having the via along a line 11C-11C in FIG. 11B.

Please refer to FIGS. 11A, 11B and 11C, FIG. 11A is a top view of a circuit board having a via according to another embodiment of the disclosure, FIG. 11B is a front cross-sectional view of the circuit board having the via along a line 11B-11B in FIG. 11A, and FIG. 11C is a top cross-sectional view of the circuit board having the via along a line 11C-11C in FIG. 11B. The configuration of the circuit board having the via 2 in this embodiment is similar to the circuit board having the via 1 shown in FIGS. 1A, 1B, 1C, 1D and 1E, so only the differences are described herein. In this embodiment, the first conductive wire 261 and the second conductive wire 262 are both located at the negative-x-axis direction of the signal conductor 24. The ground conductor 22 is located at the negative-x-axis direction of the signal conductor 24. The floated conductor 23 is located at the periphery of the signal conductor 24 and away from the negative x axis. The range of angle θ2 of the floated conductor 23 surrounding the signal conductor 24 is greater than the range of angle θ1 of the ground conductor 22 surrounding the signal conductor 24. Comparing to the circuit board having the via 1 with the range of angle θ2 of the floated conductor 13 surrounding the signal conductor 14 being substantially equal to the range of angle θ1 of the ground conductor 12 surrounding the signal conductor 14, the impedance of the path of signal transmission of the circuit board having the via 2 is greater than that of the path of signal transmission of the circuit board having the via 1. Thus, the greater the range of angle θ2 of the floated conductor 23 surrounding the signal conductor 24 is, the greater the impedance of the path of signal transmission of the circuit board having the via 2 is.

Figure 11D:
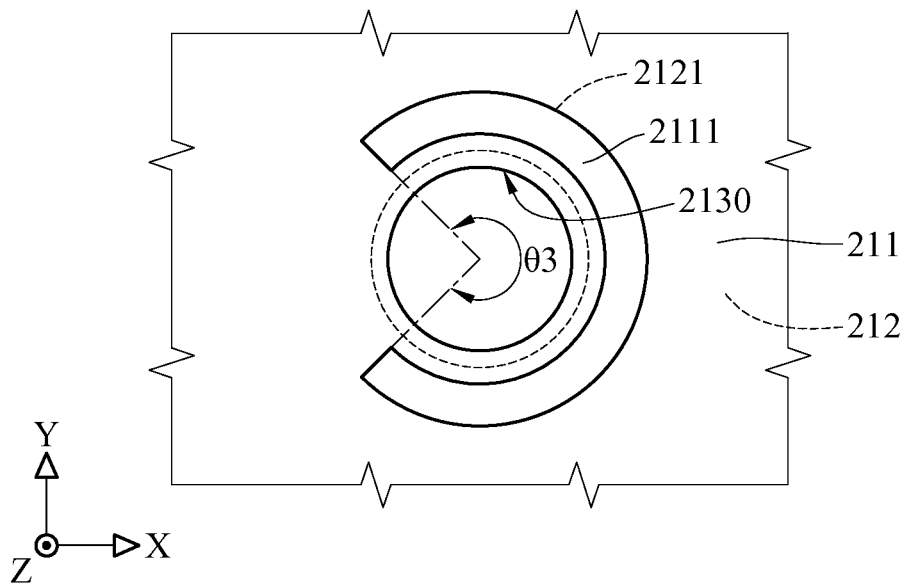
FIGS. 11D and 11E are top views of steps for manufacturing the circuit board having the via in FIGS. 11A, 11B and 11C.
Figure 11E:
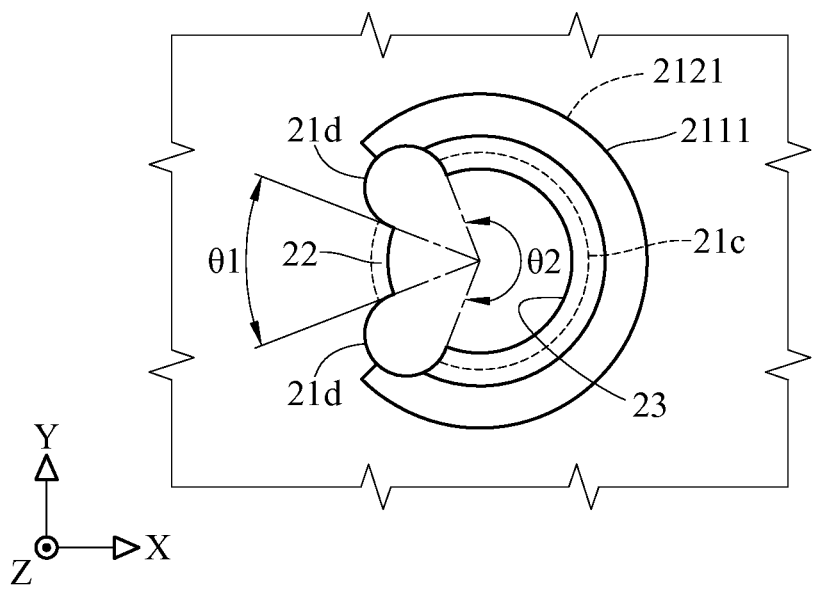

Please refer to FIGS. 11D and 11E, which are top views of steps for manufacturing the circuit board having the via in FIGS. 11A, 11B and 11C. The manufacturing method for the circuit board having the via 2 is similar to that for the circuit board having the via 1 shown in FIGS. 2A to 9A and 2B to 9B, so only the differences are described herein. As shown in FIG. 11D, in this embodiment, when a portion of the first ground layer 211 and a portion of the second ground layer 212 are removed (those are substantially overlapped with each other from the top view), the patterns and the range of angle θ3 surrounding the conductive film 2130 of the first separation groove 2111 and the second separation groove 2121 (those are substantially overlapped with each other from the top view) are enlarged. As shown in FIG. 11E, two separation holes 21d are formed in the periphery of the connecting hole 21c. The range of angle θ2 of the floated conductor 23 and the range of angle θ1 of the ground conductor 22 may be adjusted according to the sizes and locations of the first separation groove 2111 and the second separation groove 2121. In this embodiment, the range of angle θ2 of the floated conductor 23 is greater than the range of angle θ1 of the ground conductor 22.

Figure 12A:
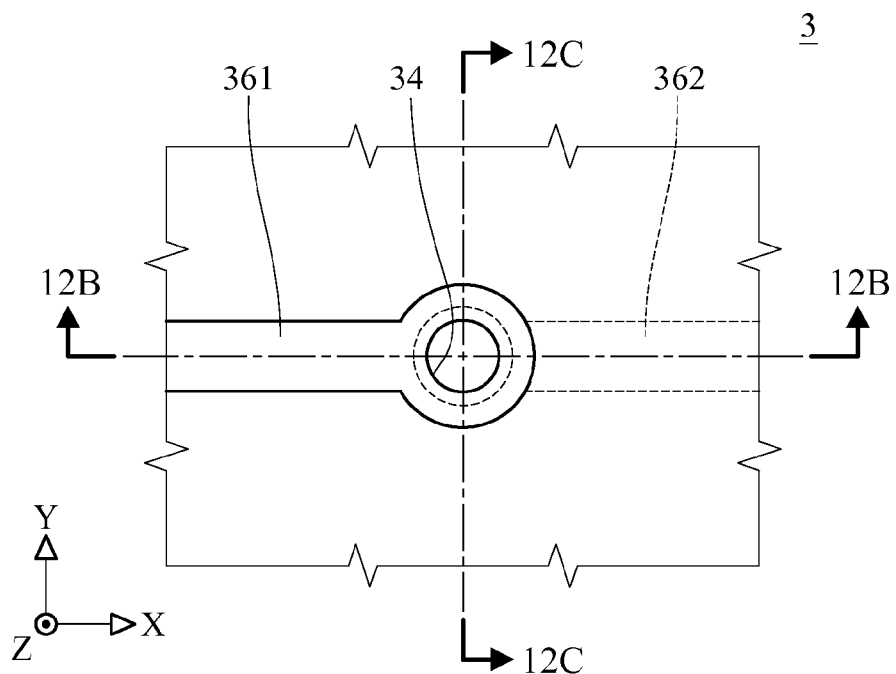
FIG. 12A is a top view of a circuit board having a via according to yet another embodiment of the disclosure.
Figure 12B:
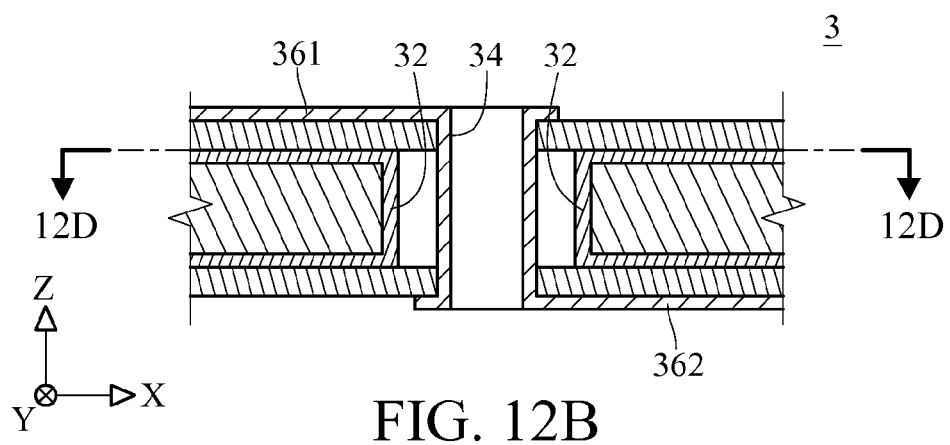
FIG. 12B is a front cross-sectional view of the circuit board having the via along a line 12B-12B in FIG. 12A.
Figure 12C:
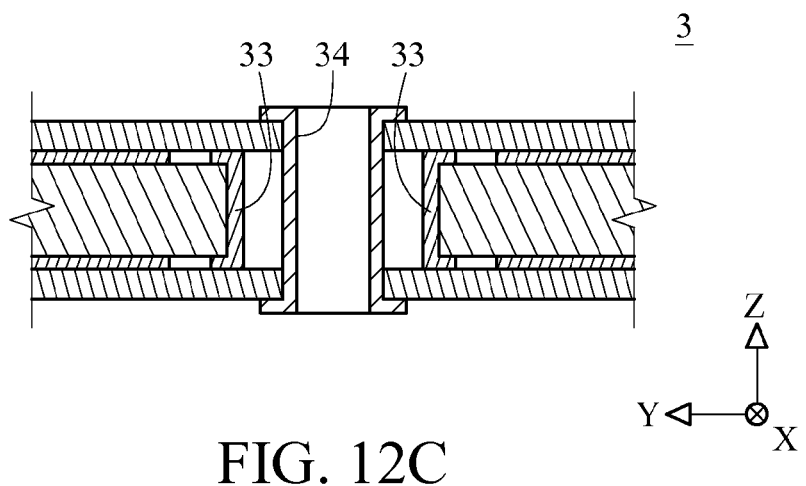
FIG. 12C is a side cross-sectional view of the circuit board having the via along a line 12C-12C in FIG. 12A.
Figure 12D:
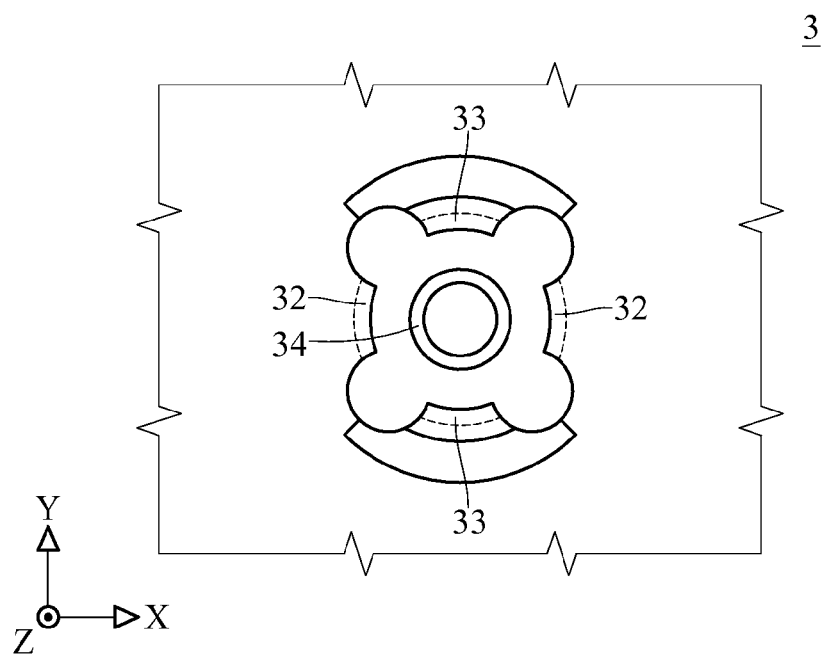
FIG. 12D is a top cross-sectional view of the circuit board having the via along a line 12D-12D in FIG. 12B.

Please refer to FIGS. 12A, 12B, 12C and 12D, FIG. 12A is a top view of a circuit board having a via according to yet another embodiment of the disclosure, FIG. 12B is a front cross-sectional view of the circuit board having the via along a line 12B-12B in FIG. 12A, FIG. 12C is a side cross-sectional view of the circuit board having the via along a line 12C-12C in FIG. 12A, and FIG. 12D is a top cross-sectional view of the circuit board having the via along a line 12D-12D in FIG. 12B. The configuration of the circuit board having the via 3 in this embodiment is similar to those of the circuit board having the via 1 shown in FIGS. 1A, 1B, 1C, 1D and 1E, only the differences are described herein. In this embodiment, the first conductive wire 361 is located at the negative-x-axis direction of the signal conductor 34, and the second conductive wire 362 is located at the positive-x-axis direction of the signal conductor 34. The number of the ground conductors 32 is two, and the number of the floated conductors 33 is also two. The ground conductors 32 are located at the positive-x-axis direction and the negative-x-axis direction of the signal conductor 34, respectively. The floated conductors 33 are located at the positive-y-axis direction and the negative-y-axis direction of the signal conductor 24.

Figure 12E:
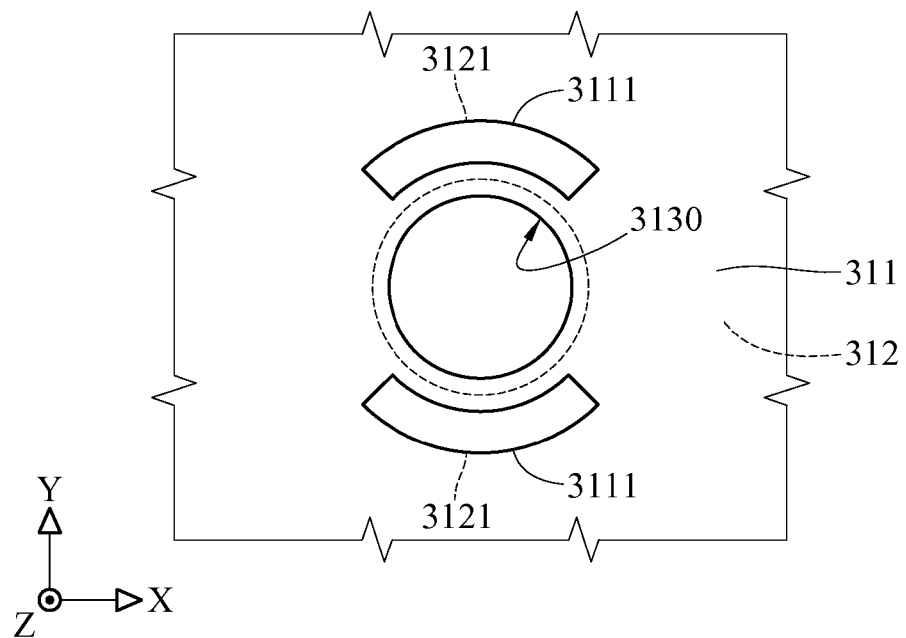
FIGS. 12E and 12F are top views of steps for manufacturing the circuit board having the via in FIGS. 12A, 12B, 12C and 12D.
Figure 12F:
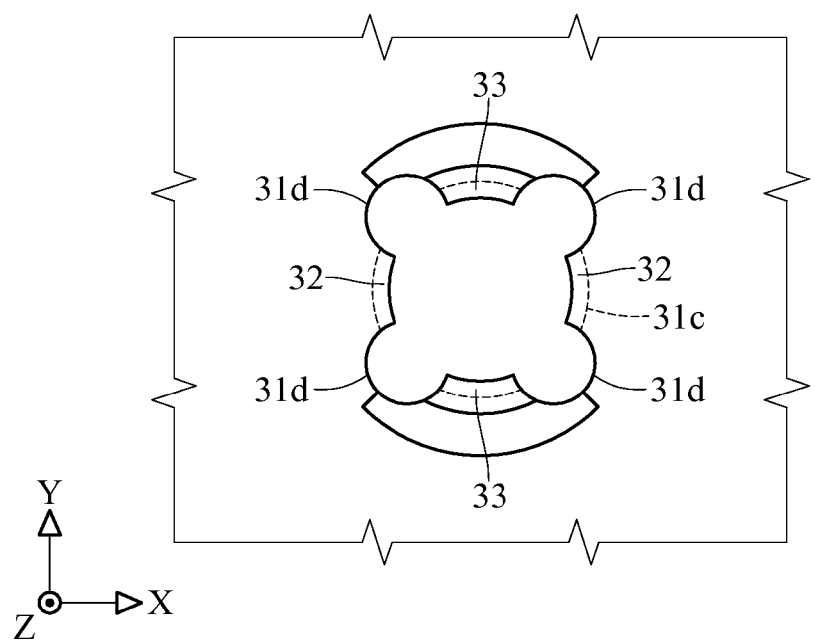

Please refer to FIGS. 12E and 12F, which are top views of steps for manufacturing the circuit board having the via in FIGS. 12A, 12B, 12C and 12D. The manufacturing method for the circuit board having the via 3 in this embodiment is similar to those for the circuit board having the via 1 shown in FIGS. 2A to 9A and 2B to 9B, so only the differences are described herein. As shown in FIG. 12E, in this embodiment, a part of the first ground layer 311 and a part of the second ground layer 312 are removed to form two first separation grooves 3111 and two second separation grooves 3121, thereby adjusting the arrangement how the first separation grooves 3111 and the second separation grooves 3121 surround the conductive film 3130. As shown in FIG. 12F, four separation holes 31d are formed in the periphery of the connecting hole 31c. The numbers of the floated conductors 33 and the ground conductors 32 may be adjusted according to the numbers and the arrangements of the first separation groove 3111 and the second separation groove 3121.

Figure 13C:
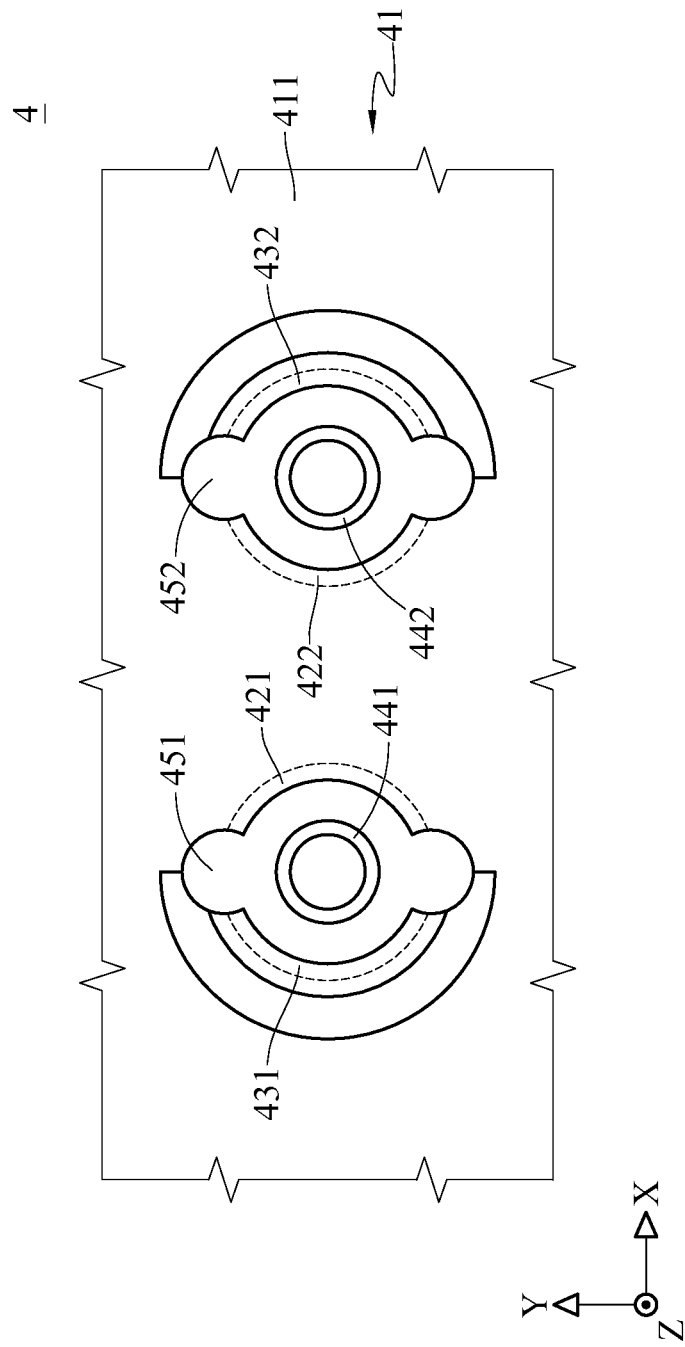
FIG. 13C is a top cross-sectional view of the circuit board having the via along a line 13C-13C in FIG. 13B.
Figure 13D:
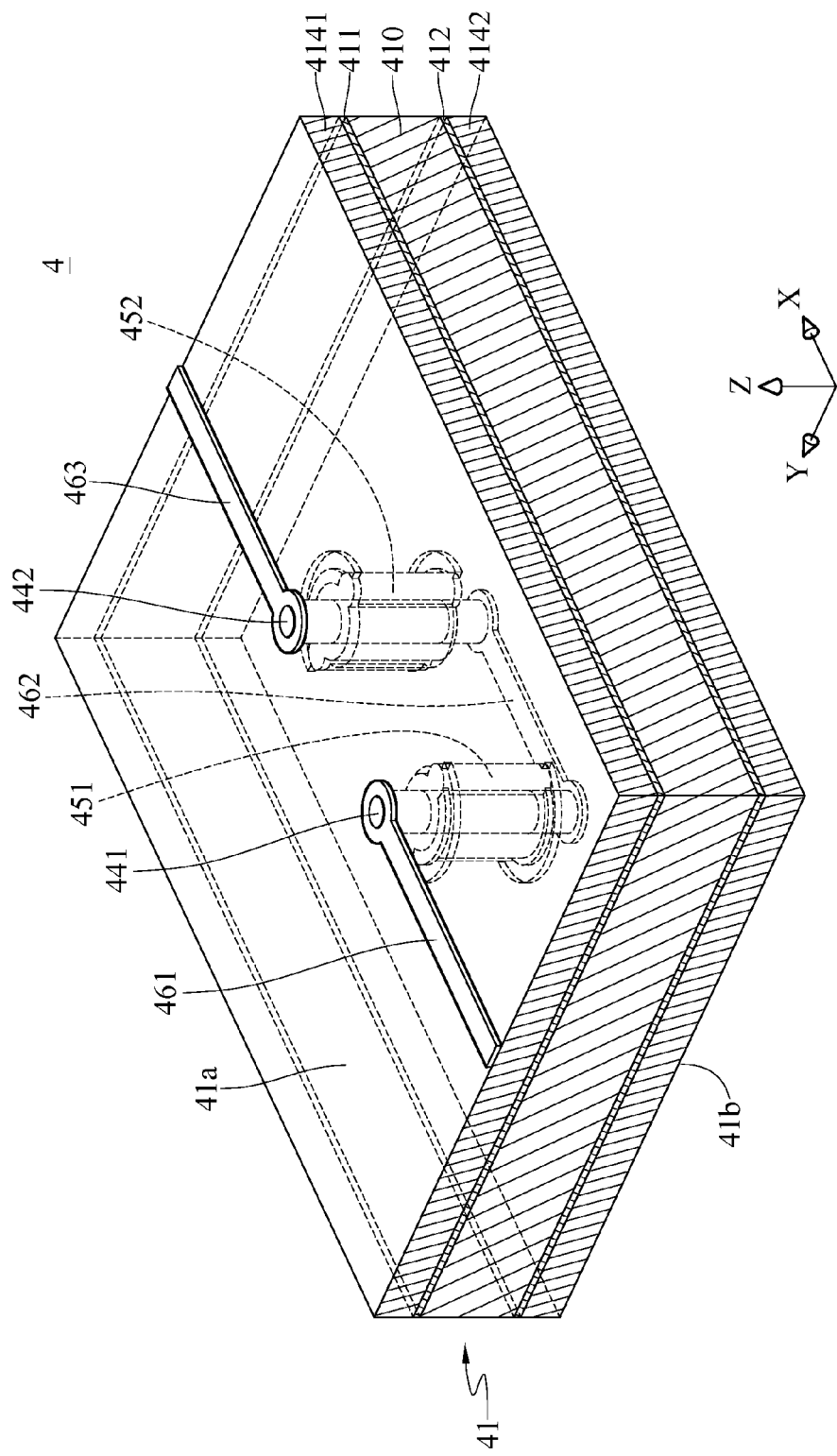
FIG. 13D is a perspective view of the circuit board having the via in FIG. 13A.

Please refer to FIGS. 13A, 13B, 13C and 13D, FIG. 13A is a top view of a circuit board having a via according to another embodiment of the disclosure, FIG. 13B is a front cross-sectional view of the circuit board having the via along a line 13B-13B in FIG. 13A, FIG. 13C is a top cross-sectional view of the circuit board having the via along a line 13C-13C in FIG. 13B, and FIG. 13D is a perspective view of the circuit board having the via in FIG. 13A. In this embodiment, The circuit board having the via 4 comprises a substrate 41, a first ground conductor 421, a second ground conductor 422, a first floated conductor 431, a second floated conductor 432, a first signal conductor 441, a second signal conductor 442, a first dielectric member 451, a second dielectric member 452, a first conductive wire 461, a second conductive wire 462 and a third conductive wire 463.

The first signal conductor 441 penetrates through the first sheet layer 4141, the first ground layer 411, the core layer 410, the second ground layer 412 of the substrate 41 and the second sheet layer 4142, and the first signal conductor 441 is located between the first ground conductor 421 and the first floated conductor 431. The first signal conductor 441 is electrically insulated from the first ground layer 411, the second ground layer 412, the first ground conductor 421 and the first floated conductor 431. The first dielectric member 451 is located between the first signal conductor 441 and the first ground conductor 421, between the first signal conductor 441 and the first floated conductor 431, and between the first ground conductor 421 and the first floated conductor 431.

The second signal conductor 442 penetrates through the first sheet layer 4141, the first ground layer 411, the core layer 410, the second ground layer 412 and the second sheet layer 4142 of the substrate 41, and the second signal conductor 442 is located between the second ground conductor 422 and the second floated conductor 432. The second signal conductor 442 is electrically insulated from the first ground layer 411, the second ground layer 412, the second ground conductor 422 and the second floated conductor 432. The second dielectric member 452 is located between the second signal conductor 442 and the second ground conductor 422, between the second signal conductor 442 and the second floated conductor 432, and between the second ground conductor 422 and the second floated conductor 432.

The first conductive wire 461 is mounted on the first surface 41a of the first sheet layer 4141 and electrically coupled to the first signal conductor 441. The second conductive wire 462 is mounted on the second surface 41b of the second sheet layer 4142 and electrically coupled to the first signal conductor 441 and the second signal conductor 442. The third conductive wire 463 is mounted on the first surface 41a of the first sheet layer 4141 and electrically coupled to the second signal conductor 442. The first floated conductor 431 is located at a side of the periphery of the first signal conductor 441 facing oppositely away from the second conductive wire 462. The second floated conductor 432 is located at a side of the periphery of the second signal conductor 442 facing oppositely away from the second conductive wire 462. The first ground conductor 421 and the second ground conductor 422 are closer to the second conductive wire 462. Therefore, The circuit which is formed by the connection of the first signal conductor 441, the second conductive wire 462 and the second signal conductor 442 is continuously refer to a common potential comprised of the first ground conductor 421, the second ground layer 412 and the second ground conductor 422. However, the above-mentioned configurations of the first ground conductor 421, the first floated conductor 431, the second ground conductor 422 and the second floated conductor 432 are not limited thereto. In other embodiments, the first floated conductor 431 and the second floated conductor 432 may also be located between the first signal conductor 441 and the second signal conductor 442. The first ground conductor 421 is closer to the first conductive wire 461, and the second ground conductor 422 is closer to the third conductive wire 463. Thus, the circuit which is formed by the connection of the first conductive wire 461 and the first signal conductor 441 is continuously refer to a common potential comprised of the first ground layer 411 and the first ground conductor 421, and the circuit which is formed by the connection of the third conductive wire 463 and the second signal conductor 442 is continuously refer to a common potential comprised of the first ground layer 411 and the second ground conductor 422.

Figure 14A:
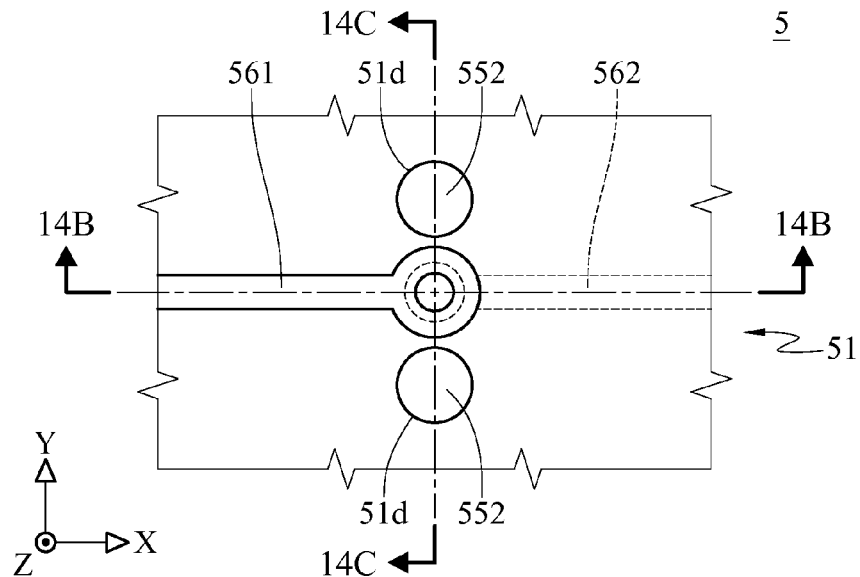
FIG. 14A is a top view of a circuit board having a via according to another embodiment of the disclosure.
Figure 14B:
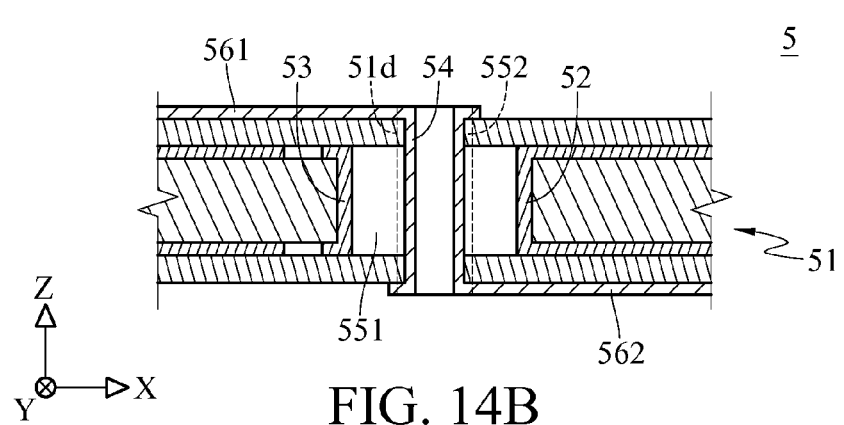
FIG. 14B is a front cross-sectional view of the circuit board having the via along a line 14B-14B in FIG. 14A.
Figure 14C:
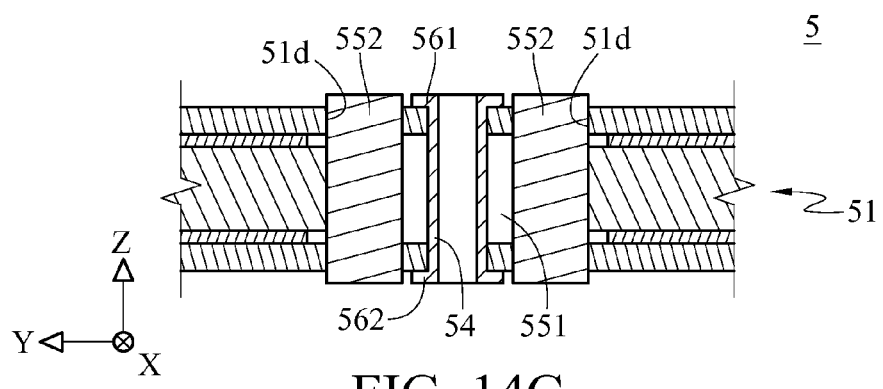
FIG. 14C is a side cross-sectional view of the circuit board having the via along a line 14C-14C in FIG. 14A.
Figure 14D:
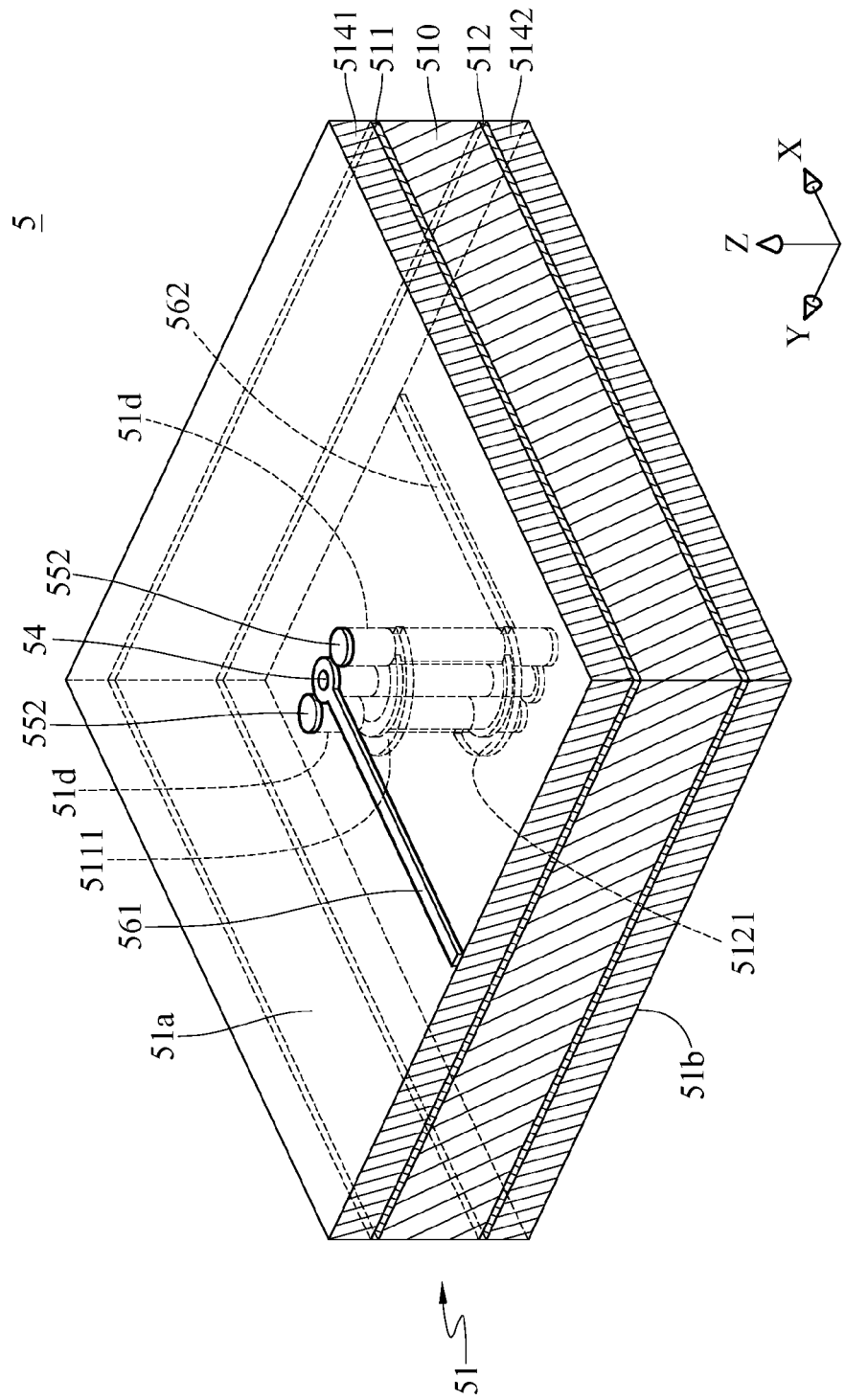
FIG. 14D is a perspective view of the circuit board having the via in FIG. 14A.

Please refer to FIGS. 14A, 14B, 14C and 14D, FIG. 14A is a top view of a circuit board having a via according to another embodiment of the disclosure, FIG. 14B is a front cross-sectional view of the circuit board having the via along a line 14B-14B in FIG. 14A, FIG. 14C is a side cross-sectional view of the circuit board having the via along a line 14C-14C in FIG. 14A, and FIG. 14D is a perspective view of the circuit board having the via in FIG. 14A. The configuration of the circuit board having the via 5 in this embodiment is similar to that of the circuit board having the via 1 shown in FIG. 1E. The circuit board having via 5 comprises a substrate 51, a ground conductor 52, a floated conductor 53, a signal conductor 54, a first conductive wire 561 and a second conductive wire 562.

However, in this embodiment, the circuit board having the via 5 further comprises a first dielectric member 551 and a second dielectric member 552. The first dielectric member 551 is located between the signal conductor 54 and the ground conductor 52, and between the signal conductor 54 and the floated conductor 53. The second dielectric member 552 is located between the ground conductor 52 and the floated conductor 53.

Figure 15A:
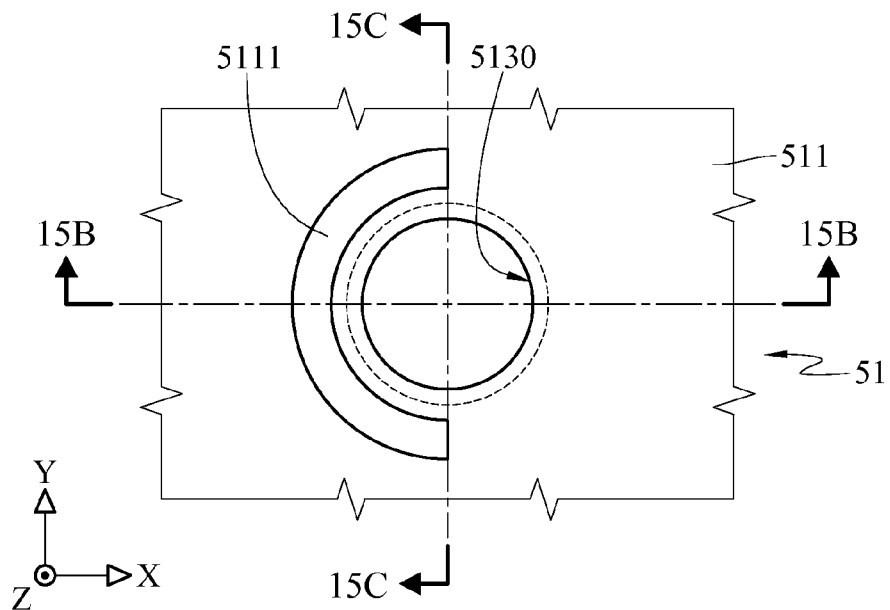
Figure 15B:
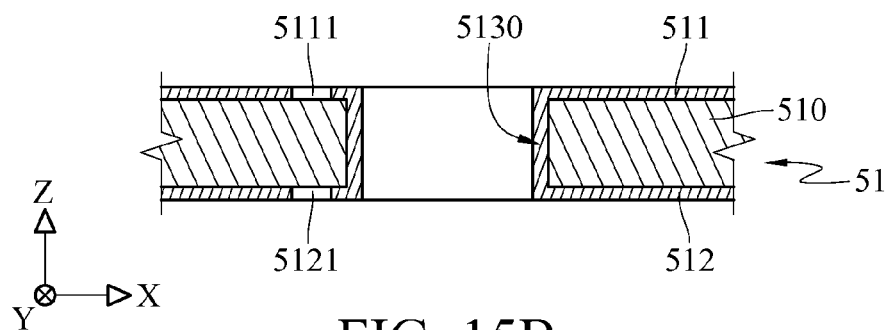
Figure 15C:
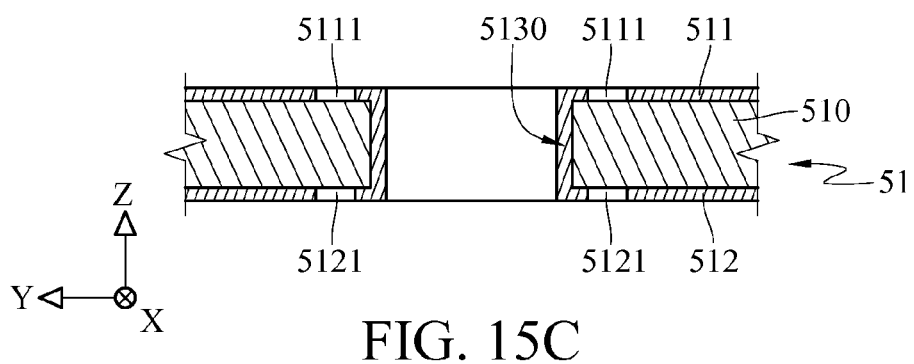

Please refer to FIGS. 15A to 19A, 15B to 19B and 15C to 19C, FIGS. 15A to 19A are top views of steps for manufacturing the circuit board having the via in FIGS. 14A, 14B, 14C, 14D and 14E, FIGS. 15B to 19B are front views of steps for manufacturing the circuit board having the via in FIGS. 14A, 14B, 14C, 14D and 14E, and FIGS. 15C to 19C are side views of steps for manufacturing the circuit board having the via in FIGS. 14A, 14B, 14C, 14D and 14E. As shown in FIGS. 15A, 15B and 15C, which a portion of the substrate 51 is manufactured. In this step, the substrate 51 includes the core layer 510, the first ground layer 511, the second ground layer 512 and the conductive film 5130. A first separation groove 5111 is formed on the first ground layer 511, and the second separation groove 5121 is formed on the second ground layer 512. The manufacturing method for a portion of the substrate 51 shown in FIGS. 15A, 15B and 15C is similar to that shown in FIGS. 2A to 5A and 2B to 5B, the difference is that the surrounding angles of the first separation groove 5111 and the second separation groove 5121 are different, so the repeated is not described herein again.

Figure 16A:
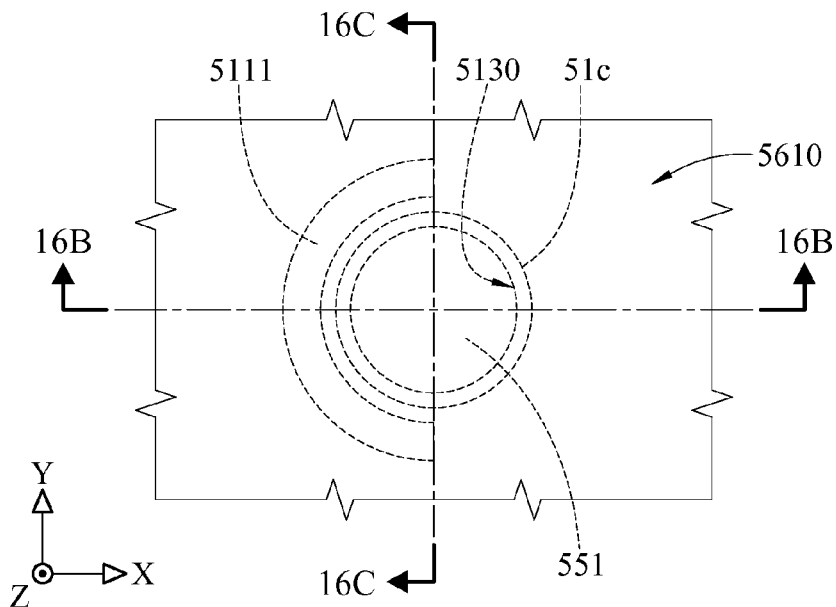
Figure 16B:
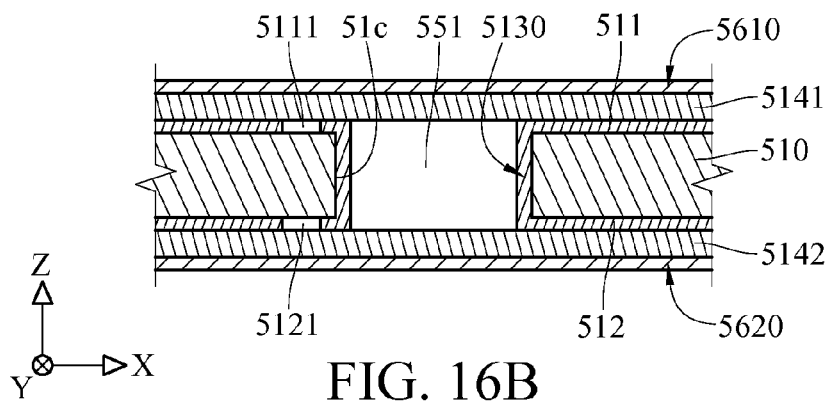
Figure 16C:
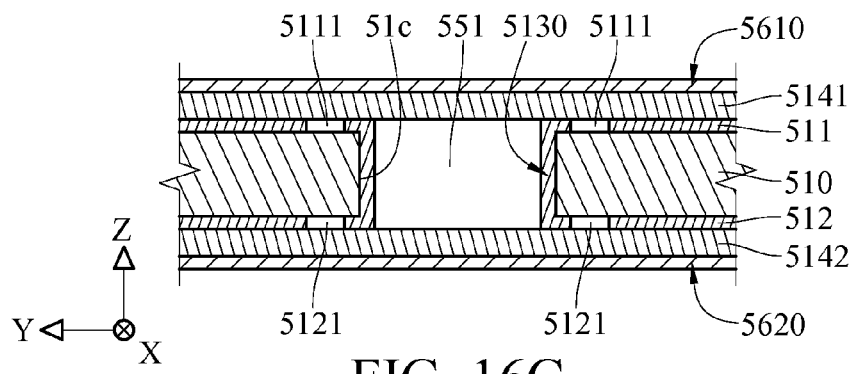

As shown in FIGS. 16A, 16B and 16C, the connecting hole 51c is filled with the first dielectric member 551. The first separation groove 5111 and the second separation groove 5121 are filled with the first dielectric member 551. A first sheet layer 5141 is formed on the surface which is formed by the first ground layer 511, the conductive film 5130 and the first dielectric member 551 together. A second sheet layer 5142 is formed on a surface formed by the second ground layer 512, the conductive film 5130 and the first dielectric member 551 together. Then, the first sheet layer 5141 is located on the first conductive wire layer 5610, and the second sheet layer 5142 is located on the second conductive wire layer 5620.

Since the first separation groove 5111 and the second separation groove 5121 are filled with the first dielectric member 551, it prevents air from entering the first separation groove 5111 and the second separation groove 5121. Therefore, the circuit board having the via 5 may not be cracked because of the expansion of air between the first sheet layer 5141, the core layer 510 and the second sheet layer 5142. However, the first separation groove 5111 and the second separation groove 5121 may be filled with, but not limited to, the first dielectric member 551. In other embodiments, the first separation groove 5111 and the second separation groove 5121 may not be filled with the first dielectric member 551, but the first separation groove 5111 is filled with a portion of the first sheet layer 5141 and the second separation groove 5121 is filled with a portion of the second sheet layer 5142 while the first sheet layer 5141 and the second sheet layer 5142 are laminated to be formed. Since the first separation groove 5111 and the second separation groove 5121 are filled with the first sheet layer 5141 and the second sheet layer 5142, respectively, it prevents air from entering the first separation groove 5111 and the second separation groove 5121. Therefore, the circuit board having the via 5 may not be cracked because of the expansion of air between the first sheet layer 5141, the core layer 510 and the second sheet layer 5142.

Figure 17A:
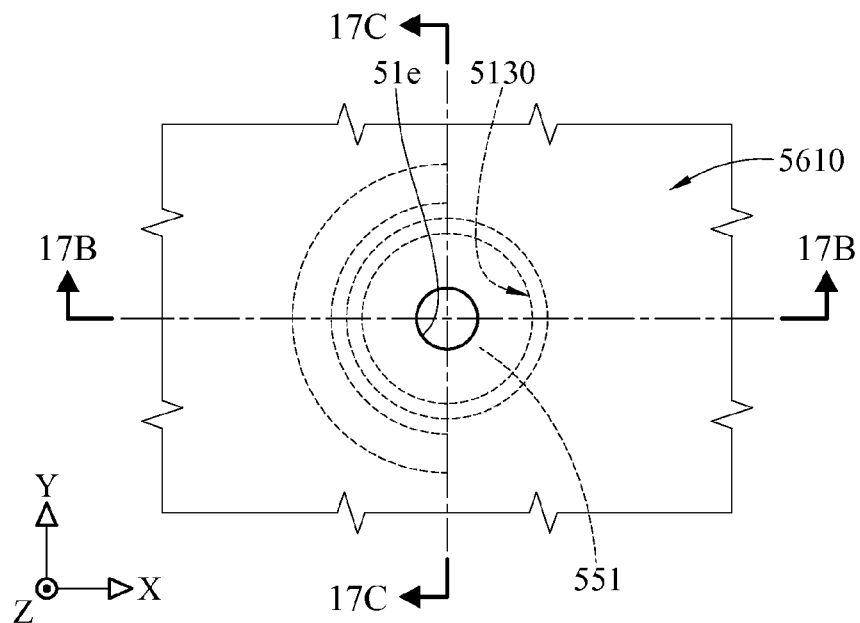
Figure 17B:
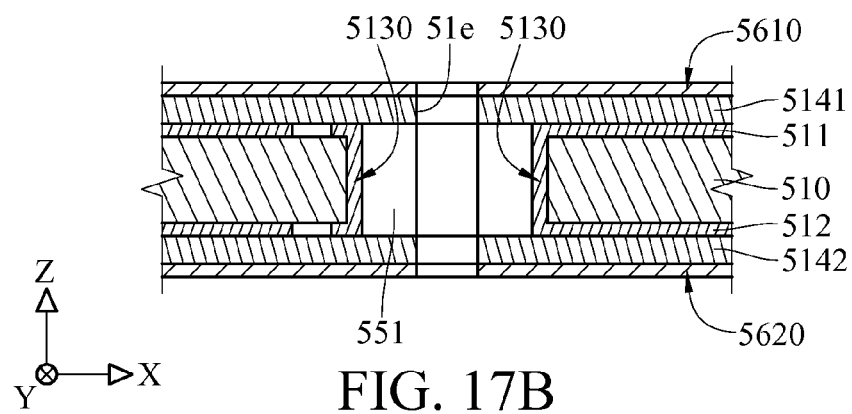
Figure 17C:
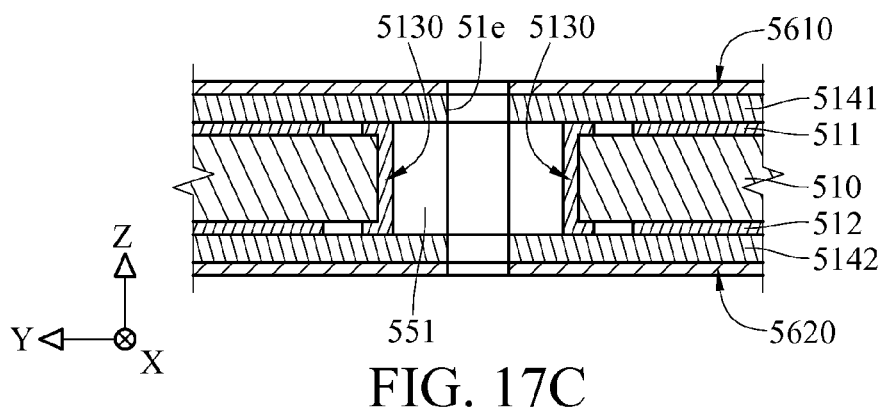

Referring to FIGS. 17A, 17B and 17C, a through hole 51e is formed with the first conductive wire layer 5610, the first sheet layer 5141, the first ground layer 511, the core layer 510, the second ground layer 512, the first dielectric member 551, the second sheet layer 5142 and the second conductive wire layer 5620. The inner wall of the through hole 51e is separated by the conductive film 5130.

Figure 18A:
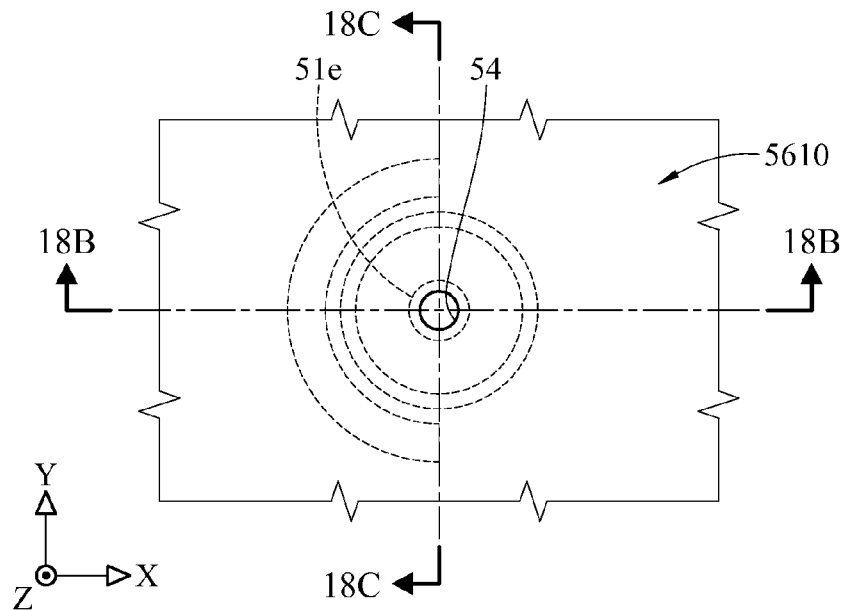
Figure 18B:
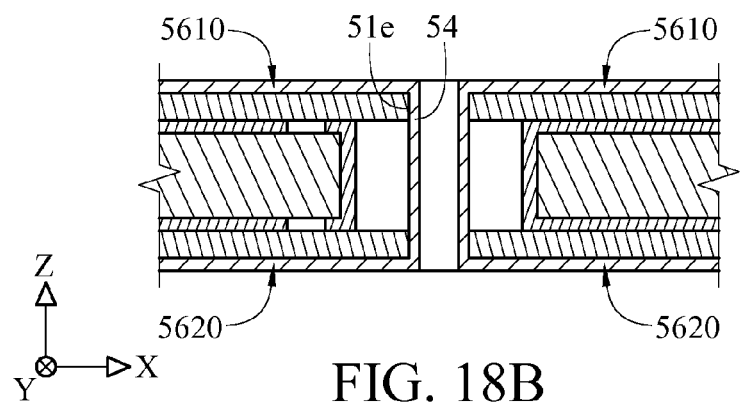
Figure 18C:
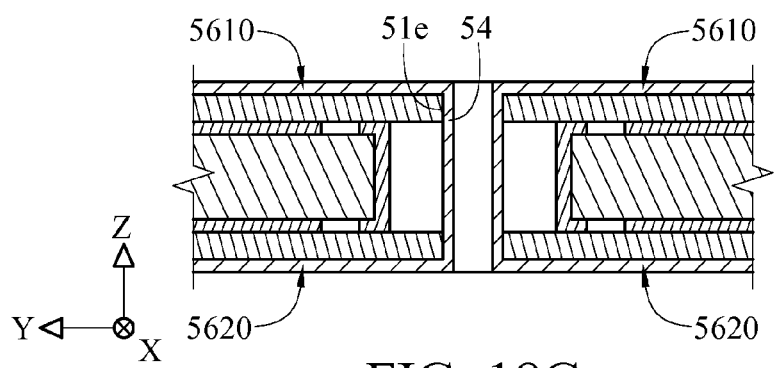

Referring to FIGS. 18A, 18B and 18C, a signal conductor 54 is formed on the inner wall of the through hole 51e, and both the first conductive wire layer 5610 and the second conductive wire layer 5620 are electrically coupled to the signal conductor 54, respectively.

Figure 19A:
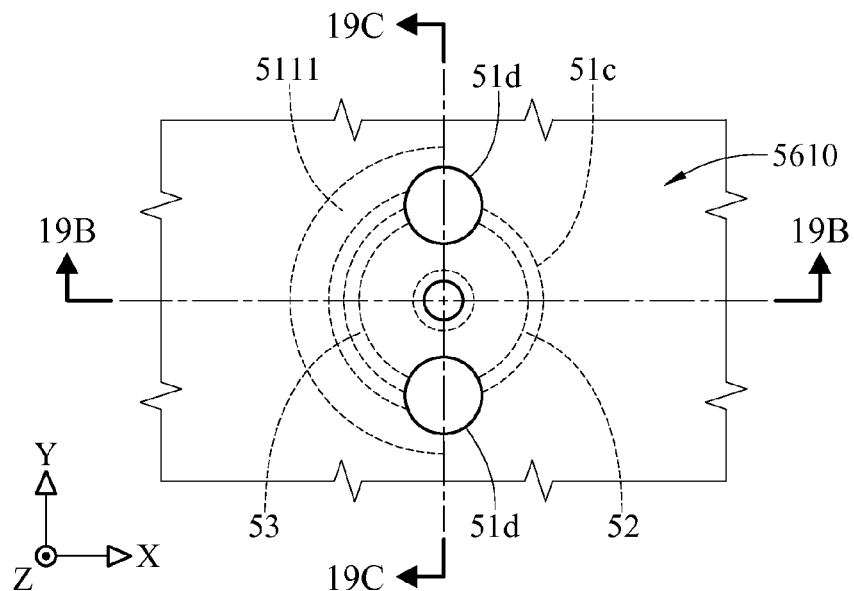
Figure 19B:
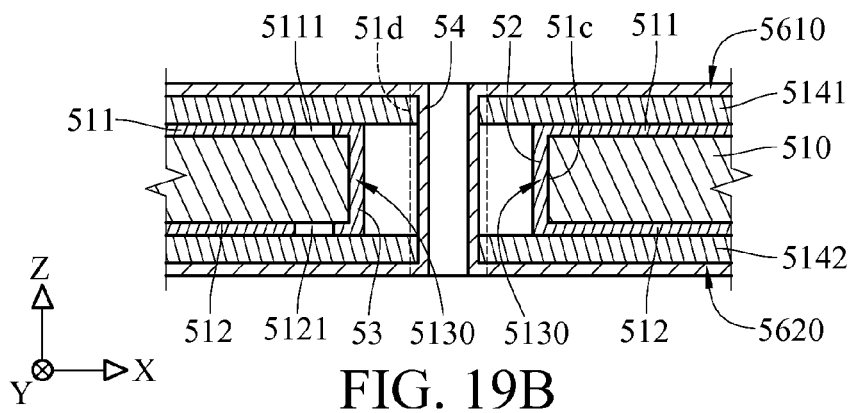
Figure 19C:
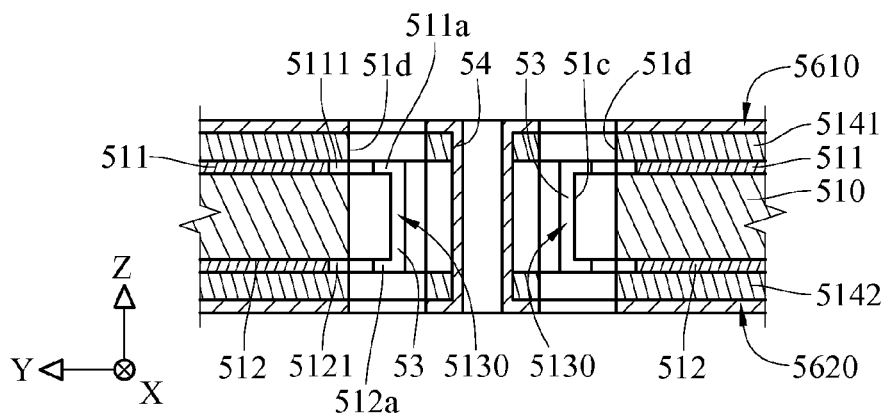

Referring to FIGS. 19A, 19B and 19C, two separation holes 51d are formed at the periphery of the connecting hole 51c. One of the separation holes 51d is coupled to one end of the first separation groove 5111 and one end of the second separation groove 5121, and the other separation hole 51d is coupled to the other end of the first separation groove 5111 and the other end of the second separation groove 5121. Also, the inner walls of the separation holes 51d and the signal conductor 54 are separated from each other by an interval. The separation holes 51d are formed within the first conductive wire layer 5610, the first sheet layer 5141, the first ground layer 511, the core layer 510, the second ground layer 512, the conductive film 5130, the second sheet layer 5142, the second conductive wire layer 5620 and the first dielectric member 551. The locations of the two separation holes 51d are partially overlapped with the first separation groove 5111, the second separation groove 5121 and the connecting hole 51c. The conductive film 5130 is divided into a ground conductor 52 and a floated conductor 53 by the two separation holes 51d, the first separation groove 5111 and the second separation groove 5121. The ground conductor 52 is electrically coupled to the first ground layer 511 and the second ground layer 512. The floated conductor 53 is electrically insulated from the signal conductor 54, the first ground layer 511, the second ground layer 512 and the ground conductor 52. Although the floated conductor 53 includes a small portion of the first ground layer 511a located between the periphery of the connecting hole 51c and the first separation groove 5111 and includes a small portion of the second ground layer 512a located between the periphery of the connecting hole 51c and the second separation groove 5121, the floated conductor 53 is electrically insulated with a major portion of the first ground layer 511 and a major portion of the second ground layer 512.

Then, referring to FIGS. 14A, 14B, 14C and 14D, the separation holes 51d are filled with a second dielectric member 552 to make the floated conductor 53 electrically insulated with the ground conductor 52, the first ground layer 511 and the second ground layer 512. Moreover, the first conductive wire layer 5610 is patterned to form a first conductive wire 561 electrically coupled to the signal conductor 54, and the second conductive wire layer 5620 is patterned to form a second conductive wire 562 of the signal conductor 54.

In conclusion, the circuit board having the via and the manufacturing method thereof may reduce the capacitance of the circuit board having the via by the disposition of the floated conductor, thereby increasing the impedance of the path of signal transmission of the via. Therefore, the impedance can be adjusted to be substantially equal to that of other circuit, thereby reducing the error rate of the signal transmission and improving the quality of the signal transmission.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

What is claimed is:

1. A circuit board having a via, comprising:
    a substrate, comprising a first sheet layer, a first ground layer, a core layer, a second ground layer and a second sheet layer, wherein the second sheet layer, the second ground layer, the core layer, the first ground layer and the first sheet layer are stacked in sequence;
    a ground conductor penetrating through the core layer and electrically coupled to the first ground layer and the second ground layer;
    a floated conductor penetrating through the core layer and electrically insulated from the first ground layer, the second ground layer and the ground conductor; and
    a signal conductor penetrating through the substrate, located between the ground conductor and the floated conductor, and insulated from the first ground layer, the second ground layer, the ground conductor and the floated conductor.

2. The circuit board having the via according to claim 1, wherein the shape of the signal conductor is a hollow tubular shape.

3. The circuit board having the via according to claim 1, wherein a plurality of dielectric members are located between the signal conductor and the ground conductor, between the signal conductor and the floated conductor, and between the ground conductor and the floated conductor.

4. The circuit board having the via according to claim 1, further comprising a first conductive wire and a second conductive wire, the first sheet layer having a first surface facing oppositely away from the first ground layer, the second sheet layer having a second surface facing oppositely away from the second ground layer, the first conductive wire being disposed on the first surface and electrically coupled to the signal conductor, and the second conductive wire being disposed on the second surface and electrically coupled to the signal conductor.

5. The circuit board having the via according to claim 4, wherein the floated conductor is located at one side of the periphery of the signal conductor facing oppositely away from the first conductive wire and the second conductive wire, and the ground conductor is located between the first conductive wire and the second conductive wire.

6. The circuit board having the via according to claim 1, wherein the distance between the floated conductor and the signal conductor is substantially equal to the distance between the ground conductor and the signal conductor.

7. The circuit board having the via according to claim 1, wherein the range of angle of the floated conductor surrounding the signal conductor is greater than or equal to the range of angle of the ground conductor surrounding the signal conductor.

8. A manufacturing method for a circuit board having a via, comprising:
    forming a first ground layer and a second ground layer on two opposite sides of a core layer, respectively;
    forming a connecting hole penetrating through the core layer, the first ground layer and the second ground layer;
    forming a conductive film on an inner wall of the connecting hole, and the conductive film being electrically coupled to the first ground layer and the second ground layer;
    forming a first separation groove and a second separation groove opposite to each other by removing a portion of the first ground layer and a portion of the second ground layer, and wherein the first separation groove and the second separation groove are located at a portion of the periphery of the connecting hole;
    forming a plurality of separation holes at the periphery of the connecting hole, the plurality of separation holes being formed within the first ground layer, the core layer, the second ground layer and the conductive film, wherein the locations of the plurality of separation holes are partially overlapped with the first separation groove, the second separation groove and the connecting hole, the conductive film is divided into a ground conductor and a floated conductor by the separation holes, the first separation groove and the second separation groove, the ground conductor is electrically coupled to the first ground layer and the second ground layer, and the floated conductor is electrically insulated from the first ground layer, the second ground layer and the ground conductor; and
    forming a signal conductor inside the connecting hole, wherein the signal conductor is electrically insulated from the first ground layer, the second ground layer, the ground conductor and the floated conductor.

9. The manufacturing method for the circuit board having the via according to claim 8, wherein the step of forming the signal conductor inside the connecting hole further comprises:
    filling the connecting hole and the plurality of separation holes with a dielectric member;
    forming a first sheet layer on a surface formed by the first ground layer, the ground conductor, the floated conductor and the dielectric member together;
    forming a second sheet layer on another surface formed by the second ground layer, the ground conductor, the floated conductor and the dielectric member together;
    forming a through hole within the first sheet layer, the first ground layer, the core layer, the second ground layer, the dielectric member and the second sheet layer, wherein the through hole is located between the ground conductor and the floated conductor, and the inner wall of the through hole is separated from the ground conductor and the floated conductor; and
    forming the signal conductor inside the through hole.

10. The manufacturing method for the circuit board having the via according to claim 9, further comprising mounting a first conductive wire on the first sheet layer, mounting a second conductive wire on the second sheet layer, and the first conductive wire and the second conductive wire being electrically coupled to the signal conductor.

11. The manufacturing method for the circuit board having the via according to claim 10, wherein the floated conductor is located at a side of the periphery of the signal conductor facing oppositely away from the first conductive wire and the second conductive wire, and the ground conductor is located between the first conductive wire and the second conductive wire.

12. The manufacturing method for the circuit board having the via according to claim 8, wherein the distance between the floated conductor and the signal conductor is substantially equal to the ground conductor and the signal conductor.

13. The manufacturing method for the circuit board having the via according to claim 8, wherein a range of angle of the floated conductor surrounding the signal conductor is greater than or equal to another range of angle of the ground conductor surrounding the signal conductor.

14. A manufacturing method for a circuit board having a via, comprising:
   forming a first ground layer and a second ground layer on two opposite surfaces of a core layer;
   forming a connecting hole penetrating through the core layer, the first ground layer and the second ground layer;
   forming a conductive film on an inner wall of the connecting hole, and the conductive film being electrically coupled to the first ground layer and the second ground layer;
   forming a first separation groove and a second separation groove opposite to each other by removing a portion of the first ground layer and a portion of the second ground layer, and the first separation groove and the second separation groove both being located at a portion of the periphery of the connecting hole;
   filling the connecting hole with a first dielectric member;
   forming a first sheet layer on a surface formed by the first ground layer and the first dielectric member together;
   forming a second sheet layer on another surface formed by the second ground layer and the first dielectric member together;
   forming a through hole within the first sheet layer, the first ground layer, the core layer, the second ground layer, the first dielectric member and the second sheet layer, an inner wall of the through hole is separated from the conductive film;
   forming a signal conductor on an inner wall of the through hole, and the signal conductor is electrically insulated with the first ground layer, the second ground layer and the conductive film; and
   forming a plurality of separation holes in the periphery of the connecting hole, inner walls of the plurality of separation holes and the signal conductor being separated by an interval, the plurality of separation holes penetrating through the first sheet layer, the first ground layer, the core layer, the second ground layer, the conductive film, the first dielectric member and the second sheet layer, wherein the locations of the plurality of separation holes are partially overlapped with the first separation groove, the second separation groove and the connecting hole, the conductive film is divided into a ground conductor and a floated conductor by the plurality of separation holes, the first separation groove and the second separation groove, wherein the ground conductor is electrically coupled to the first ground layer and the second ground layer, and the floated conductor is electrically insulated from the signal conductor, the first ground layer, the second ground layer and the ground conductor.

15. The manufacturing method for the circuit board having the via according to claim 14, further comprising mounting a first conductive wire on the first sheet layer, mounting a second conductive wire on the second sheet layer, and the first conductive wire and the second conductive wire both being electrically coupled to the signal conductor.

16. The manufacturing method for the circuit board having the via according to claim 15, wherein the floated conductor is located at a side of the periphery of the signal conductor facing oppositely away from the first conductive wire and the second conductive wire, and the ground conductor is located between the first conductive wire and the second conductive wire.

17. The manufacturing method for the circuit board having the via according to claim 14, further comprising filling the plurality of separation holes with a second dielectric member.

18. The manufacturing method for the circuit board having the via according to claim 14, wherein the distance between the floated conductor and the signal conductor is substantially equal to the distance between the ground conductor and the signal conductor.

19. The manufacturing method for the circuit board having the via according to claim 14, wherein the range of angle of the floated conductor surrounding the signal conductor is greater than or equal to the range of angle of the ground conductor surrounding the signal conductor.

* * * * *